(12) United States Patent
Foong

(10) Patent No.: US 10,043,563 B2
(45) Date of Patent: Aug. 7, 2018

(54) FLIP-FLOP CIRCUIT, METHOD OF CONTROLLING A FLIP-FLOP CIRCUIT AND MEMORY DEVICE

(71) Applicant: Agency For Science, Technology and Research, Singapore (SG)

(72) Inventor: Huey Chian Foong, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 15/517,745

(22) PCT Filed: Oct. 15, 2015

(86) PCT No.: PCT/SG2015/050390
§ 371 (c)(1),
(2) Date: Apr. 7, 2017

(87) PCT Pub. No.: WO2016/060617
PCT Pub. Date: Apr. 21, 2016

(65) Prior Publication Data
US 2017/0243624 A1      Aug. 24, 2017

(30) Foreign Application Priority Data
Oct. 15, 2014   (SG) ............................ 10201406633X

(51) Int. Cl.
*G11C 7/00*      (2006.01)
*G11C 11/16*    (2006.01)

(52) U.S. Cl.
CPC ...... *G11C 11/1673* (2013.01); *G11C 11/1675* (2013.01); *G11C 11/1693* (2013.01)

(58) Field of Classification Search
CPC . G11C 29/46; G11C 11/6007; G11C 11/1673; G11C 11/1675; G11C 11/1693; G11C 21/00; G11C 7/1045

(Continued)

(56) References Cited

U.S. PATENT DOCUMENTS

| 3,471,838 A | 10/1969 | Ricketts et al. |
| 5,706,232 A * | 1/1998 | McClure ................ G11C 29/46 365/195 |

(Continued)

FOREIGN PATENT DOCUMENTS

WO    WO2010007173    1/2010

OTHER PUBLICATIONS

Zhang, et al., Compact Modeling of Perpendicular-Anisotropy CoFeB/MgO Magnetic Tunnel Junctions, 59 IEEE Transactions on Electron Devices 819 (IEEE 2012).

(Continued)

*Primary Examiner* — Gene Auduong
(74) *Attorney, Agent, or Firm* — K. David Crockett, Esq.; Crockett & Crockett, PC

(57) ABSTRACT

According to embodiments of the present invention, a flip-flop circuit is provided. The flip-flop circuit includes a first stage circuit and a second stage circuit, wherein each of the first stage circuit and the second stage circuit is operable in two modes of operation, and a driver arrangement, wherein the first stage circuit includes a first transistor and a first non-volatile memory cell connected to each other, wherein the second stage circuit includes a second transistor and a second non-volatile memory cell connected to each other, and wherein the driver arrangement is configured, at a clock level, to drive the first stage circuit in one of the two modes of operation to access the first non-volatile memory cell and, at the clock level, to drive the second stage circuit in the other of the two modes of operation to access the second non-volatile memory cell.

18 Claims, 15 Drawing Sheets

(58) Field of Classification Search
USPC ............ 365/189.14, 189.15, 189.16, 230.06
See application file for complete search history.

(56) References Cited

U.S. PATENT DOCUMENTS

| | | | | |
|---|---|---|---|---|
| 7,525,527 | B2* | 4/2009 | Sekine | G09G 3/3614 345/103 |
| 9,325,309 | B2* | 4/2016 | Wu | H03K 17/28 |
| 2010/0271866 | A1 | 10/2010 | Sakimura et al. | |
| 2011/0228594 | A1 | 9/2011 | Rao et al. | |
| 2012/0195151 | A1 | 8/2012 | Ostermayr et al. | |

OTHER PUBLICATIONS

Li, et al., CACTI-P: Architecture-Level Modeling for SRAM-based Structures with Advanced Leakage Reduction Techniques, IEEE/ACM Int. Conf on Computer-Aided Design 694 (IEEE 2011).
Ando, et al., Spin-Transfer Torque Magnetoresistive Random-Access Memory Technologies for Normally Off Computing, 115 Journal of Applied Physics 172607 (2014).

* cited by examiner

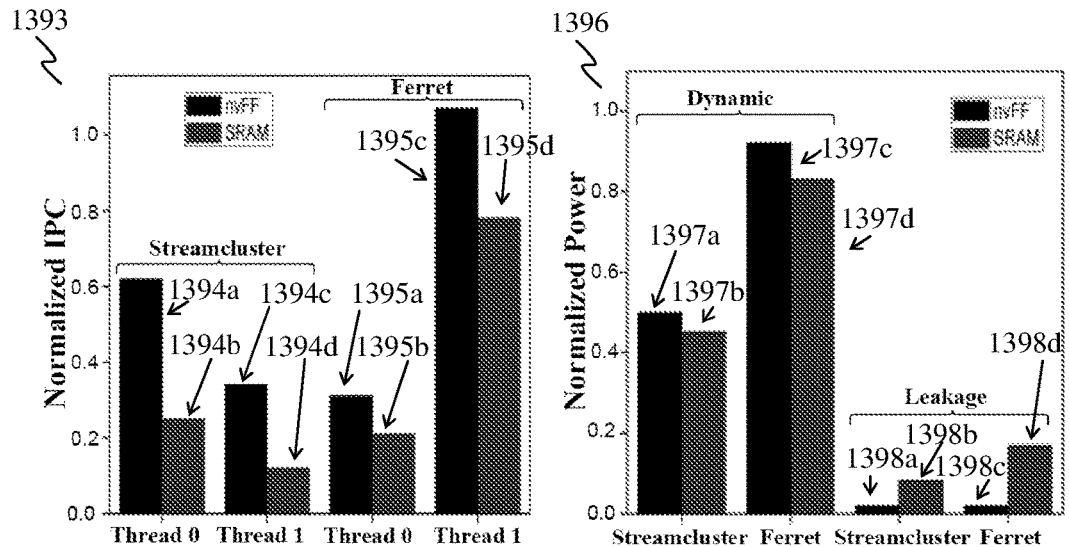
FIG. 13E
FIG. 13F
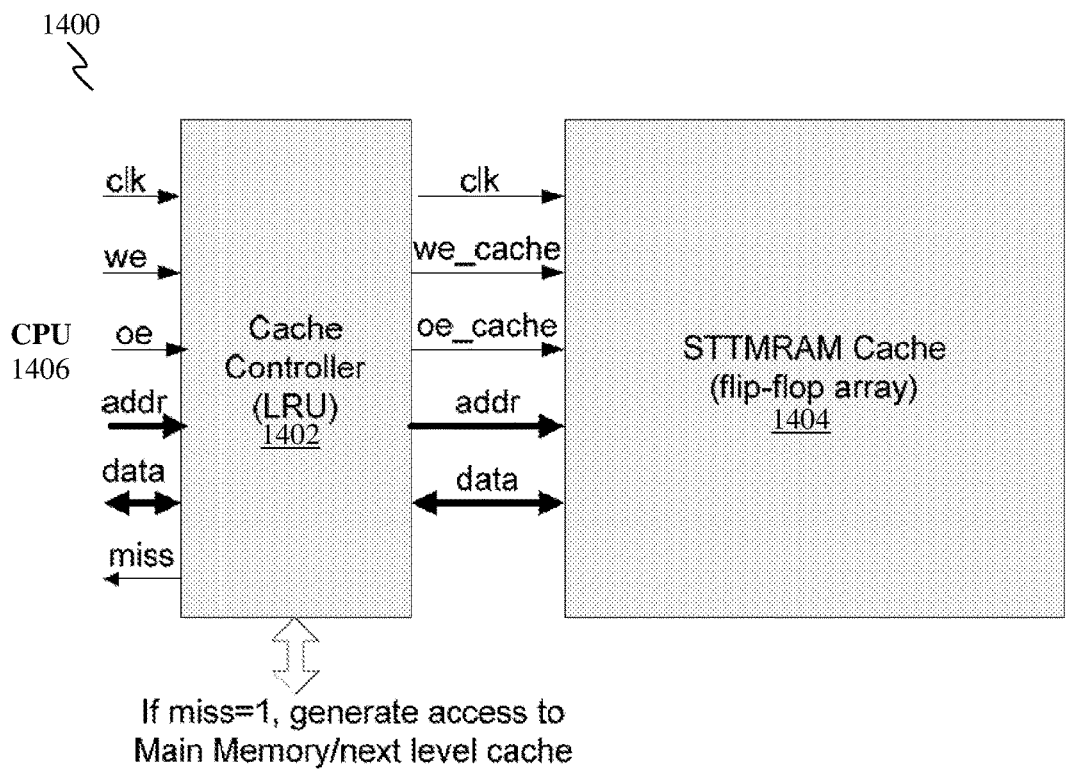
FIG. 14

FLIP-FLOP CIRCUIT, METHOD OF CONTROLLING A FLIP-FLOP CIRCUIT AND MEMORY DEVICE

CROSS-REFERENCE TO RELATED APPLICATION

This application claims the benefit of priority of Singapore patent application No. 10201406633X, filed on 15 Oct. 2014, the content of it being hereby incorporated by reference in its entirety for all purposes.

TECHNICAL FIELD

Various embodiments relate to a flip-flop circuit, a memory device and a method of controlling a flip-flop circuit.

BACKGROUND

Conventional flip-flops, for example, conventional complementary metal-oxide semiconductor (CMOS) flip-flops), are generally volatile. With the advent of deep sub-micron CMOS technology, leakage power increases significantly while squeezing more performance on smaller area and supply voltages. In particular, conventional CMOS registers suffer significant power loss from off-state (static) leakage. For example, during idle mode, data has to be transferred to shadow latch and power supply has to be maintained to hold the data, which consumes leakage power. In other words, shadow latch needs to be power-on during idle mode and is susceptible to leakage current and consumes leakage power. Data may also be transferred to a flash memory, which typically has limited speed performance and requires high control voltage. The flash memory also faces challenges in scaling below 20 nm. Further, the saving and reloading of data to/from the flash memory increases the wake-up time from idle mode to normal operation. Extra or additional circuits may be needed for the control of "save" and "reload" operations.

Non-volatile registers or flip-flops (nvFFs) are envisaged to play an increasingly important role as they may be powered-off in sleep mode (or idle mode) with zero leakage. Various non-volatile flip-flops have been proposed, which have zero power consumption in idle mode. Conventional non-volatile flip-flops bear similar architectures to a static latch-based master-slave register. However, such non-volatile flip-flops, for example, resistive non-volatile flip-flops, are generally slow because of static differential latch architecture that has high parasitic capacitance (e.g., at the internal nodes of the flip-flops) and therefore not suitable for ultra-high speed and low-power arithmetic logic unit (ALU) registers, register files and cache applications.

A spin-transfer torque magnetic random-access memory (STTMRAM) is a promising candidate for nvFF due to its high write speed and endurance cycle, low write power and zero standby power. In other words, for the STTMRAM with high endurance and low write energy, "save" and "reload" operations may not be required. nvFFs with STT-MRAM have been mainly proposed to address the leakage current issue. Typically, these nvFFs resemble a sense-amplifier based master-slave register, and have cross-coupled inverters as the output stage. This type of registers poses delay issue, due to the inherent latch time of the cross-coupled inverters and the high parasitic capacitance at the internal nodes.

FIG. 1 shows a simplified representative diagram 100 illustrating typical access times of memory in computer systems. Various stages may involve different access times. For example, a storage 102 may have an access time of about 1 ms, a memory 104 may have an access time of about 10-30 ns, a cache (level 2 (L2), or level 3 (L3)) 106 may have an access time of about 3-10 ns, and a logic/flip-flop/register file cache (level 1 (L1)) 108 may have an access time of less than 1 ns. A resistive random-access memory (RRAM) 110 may be employed for the storage 102, the memory 104, and the cache (L2, L3) 106, and a STT-MRAM 112 may be employed for the memory 104, the cache (L2, L3) 106, and the logic/flip-flop/register file cache (L1) 108. Conventional non-volatile flip-flops are generally too slow for high performance logic applications, register files and L1-L3 cache in a high speed microprocessor.

To achieve high performance, especially in portable applications, non-volatile flip-flops need to be both fast and energy-efficient.

SUMMARY

According to an embodiment, a flip-flop circuit is provided. The flip-flop circuit may include a first stage circuit and a second stage circuit, wherein each of the first stage circuit and the second stage circuit is operable in two modes of operation, and a driver arrangement, wherein the first stage circuit includes a first transistor and a first non-volatile memory cell connected to each other, wherein the second stage circuit includes a second transistor and a second non-volatile memory cell connected to each other, and wherein the driver arrangement is configured, at a clock level, to drive the first stage circuit in one of the two modes of operation to access the first non-volatile memory cell and, at the clock level, to drive the second stage circuit in the other of the two modes of operation to access the second non-volatile memory cell.

According to an embodiment, a memory device is provided. The memory device may include a plurality of flip-flop circuits, wherein each flip-flop circuit of the plurality of flip-flop circuits is as described herein, and a controller configured to control operation of the plurality of flip-flop circuits.

According to an embodiment, a method of controlling a flip-flop circuit is provided. The flip-flop circuit may include a first stage circuit and a second stage circuit, wherein each of the first stage circuit and the second stage circuit is operable in two modes of operation. The method may include driving, at a clock level, the first stage circuit in one of the two modes of operation to access a first non-volatile memory cell of the first stage circuit, and driving, at the clock level, the second stage circuit in the other of the two modes of operation to access a second non-volatile memory cell of the second stage circuit.

BRIEF DESCRIPTION OF THE DRAWINGS

In the drawings, like reference characters generally refer to like parts throughout the different views. The drawings are not necessarily to scale, emphasis instead generally being placed upon illustrating the principles of the invention. In the following description, various embodiments of the invention are described with reference to the following drawings, in which:

FIG. 13E shows a plot illustrating a comparison of instruction per cycle (IPC) of a microprocessor (μP) system including or consisting of the non-volatile first-in-first-out (nvFIFO) architecture in accordance with various embodiments and a static random-access memory first-in-first-out (SRAM FIFO) architecture.

FIG. 13F shows a plot illustrating a comparison of dynamic and leakage power of a microprocessor (μP) system including or consisting of the non-volatile first-in-first-out (nvFIFO) architecture in accordance with various embodiments and a static random-access memory first-in-first-out (SRAM FIFO) architecture.

FIG. 14 shows a schematic diagram illustrating an architecture of a cache system for processor based on the flip-flop circuit of various embodiments.

DETAILED DESCRIPTION

Figure 1:
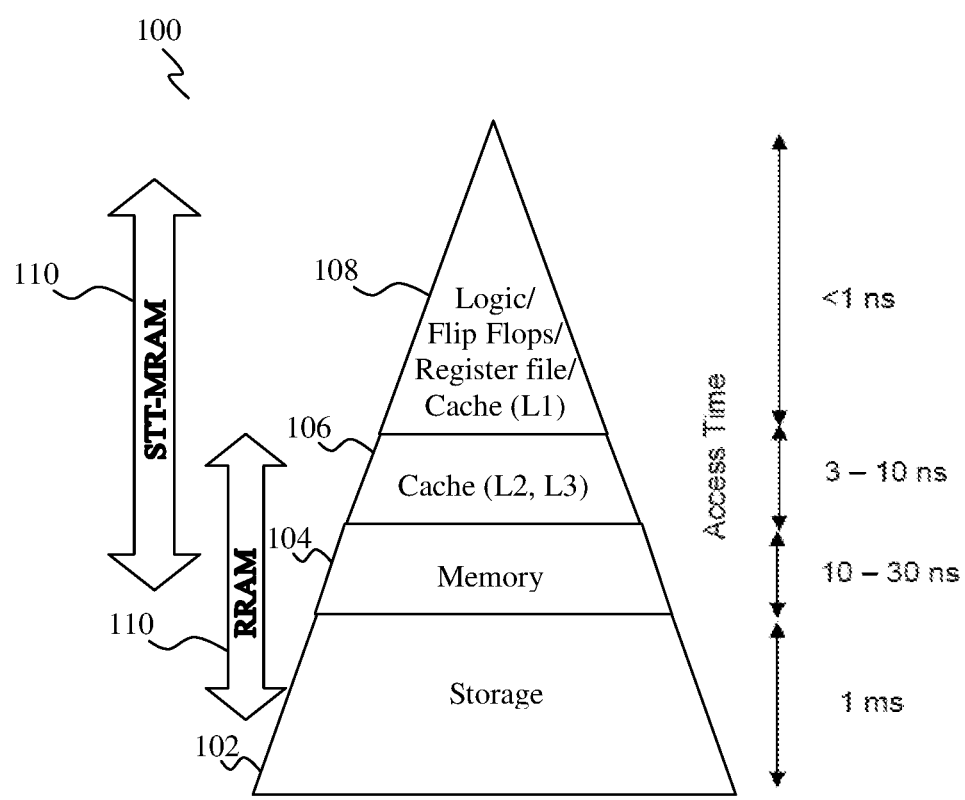
FIG. 1 shows a simplified representative diagram illustrating typical access times of memory in computer systems

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Embodiments described in the context of one of the methods or devices are analogously valid for the other methods or devices. Similarly, embodiments described in the context of a method are analogously valid for a device, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

In the context of various embodiments, the articles "a", "an" and "the" as used with regard to a feature or element include a reference to one or more of the features or elements.

In the context of various embodiments, the term "about" as applied to a numeric value encompasses the exact value and a reasonable variance.

As used herein, the term "and/or" includes any and all combinations of one or more of the associated listed items.

Various embodiments may provide a flip-flop circuit such as a non-volatile flip-flop.

Various embodiments may provide a non-volatile flip-flop with at least one of the followings: improved normal operating speed, reduced standby power consumption, reduced wake-up time, a simple and efficient method of operation, unnecessary read-write disturbance being avoided, and improved reliability.

Various embodiments may provide non-volatile flip-flop and system applications.

Various embodiments may provide a non-volatile flip-flop for use in high performance applications, e.g., in high speed microprocessors and interface applications.

Various embodiments may provide non-volatile registers or flip-flops (nvFFs) that form part of a normally-off microprocessor (μP) system that may be completely turned-off at short intervals during standby, thereby reducing the energy consumption significantly. The normally-off μP system may require non-volatility in all or at least a majority of its functional blocks, in particular the network interface. Having a non-volatility first-in-first-out (nvFIFO) buffer in a network interface, not only data may be held in the streaming pipeline during standby, the data may also be recovered instantly during wake-up.

Various embodiments may provide a high speed non-volatile Flip-Flop (nvFF) circuit based on resistive memory and its application in a First-In-First-Out (FIFO) register file and a level 1 (L1) cache system. The nvFF may be designed based on a two-stage pipeline approach as compared to the conventional master-slave static latch approach. Such a dynamic two-stage pipeline approach may achieve high speed operation without latch. Each stage may be or may include a single-ended topology including or consisting of one resistive non-volatile memory (NVM) cell. In various embodiments, a write driver and a read driver may be shared between the first and second stages by using analog multiplexers (not digital), which reduces the integrated circuit (IC) area. An analog multiplexer may include or consist of two transmission gates controlled by a pair of complementary signal in the context of various embodiments. In other words, smaller area and lower power may be achieved by sharing the write driver and the read driver. This may be realized by multiplexing the two stages (i.e., the first and second stages).

In various embodiments, the first and second stages may operate in different operations during each clock phase: when first stage is operating in write mode (or write operation), the second stage is in read operation (or operating in read mode) and vice-versa during each clock phase (e.g., clock high and clock low may represent two different phases). The determination of logic high or logic low may be carried out by comparing a read current with a reference current generated by a mid-point reference circuit which may be shared among multiple flip-flops. Thus, no sense amplifier may be required in the nvFF, which in turn saves (or reduces) IC area.

The nvFF circuit of various embodiments may have small parasitic capacitance at the internal nodes, which may result in higher speed. The power consumption may decrease with reduced parasitic capacitance and the speed may also increase due to faster rise time and fall time. In other words, the circuit may have small internal parasitic capacitance, which may result in faster switching speed and reduced dynamic power. Further, in various embodiments, the multiplexer(s) may prevent or at least minimize leakage current flowing through the memory cells during an idle mode Various embodiments may provide a flip-flop circuit (e.g., nvFF) including, but not limited to, at least one of the following advantages. For example, the nvFF in accordance with various embodiments may have a capability of high speed operation with reduced parasitic capacitance as differential latch is not required in the nvFF, reduced area by multiplexing the write and read drivers of the two stages, immediate storing of data without the need of extra input signal to activate a "save" operation, and lower power consumption due to reduced parasitic capacitance. Further, the nvFF in accordance with various embodiments may prevent or at least minimize unwanted write and read disturbance by using clamping transistors, may have fast current-comparison to generate directly the output logic for each stage, may not require a sense amplifier since only a buffer or an inverter may be required for sensing, may have higher performance in terms of energy-delay product as compared to existing memory structures, and may be easily integrated into register file and cache systems.

Various embodiments may provide a non-volatile flip-flop (nvFF) based on spin-transfer torque random access memory (STTMRAM).

Various embodiments may provide an ultra-fast and low energy STTMRAM flip-flop and its system applications.

Various embodiments may provide designs for nvFF and nvFIFO based on spin-transfer torque magnetic random-access memory (STTMRAM), targeted for a high speed non-volatile network interface. By leveraging the dynamic pipeline approach and high switching speed of a magnetic tunnel junction (MJT), the nvFF may achieve high operating speed, fast backup and restore time, and low energy consumption.

Figure 2A:
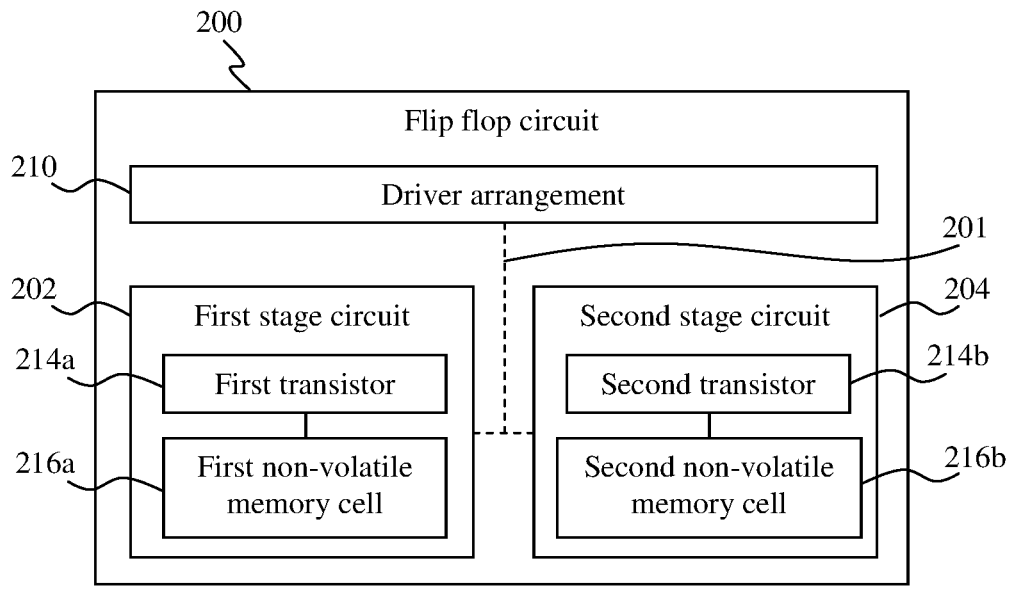
FIG. 2A shows a schematic cross-sectional view of a flip-flop circuit, according to various embodiments.

FIG. 2A shows a schematic cross-sectional view of a flip-flop circuit 200, according to various embodiments. The flip-flop circuit 200 includes a first stage circuit 202 and a second stage circuit 204, wherein each of the first stage circuit 202 and the second stage circuit 204 is operable in two modes of operation, a driver arrangement 210, wherein the first stage circuit 202 includes a first transistor 214a and a first non-volatile memory (NVM) cell 216a connected to each other, wherein the second stage circuit 204 includes a second transistor 214b and a second non-volatile memory (NVM) cell 216b connected to each other, and wherein the driver arrangement 210 is configured, at a clock level, to drive the first stage circuit 202 in one of the two modes of operation to access the first non-volatile memory cell 216a and, at the clock level, to drive the second stage circuit 204 in the other of the two modes of operation to access the second non-volatile memory cell 216b.

In other words, a flip-flop circuit 200 may be provided, having a first stage circuit 202 and a second stage circuit 204 that are operable in two modes of operation. The first stage circuit 202 and the second stage circuit 204 may be coupled to each other, as represented by the dashed line 201. Each of the first stage circuit 202 and the second stage circuit 204 may include a transistor 214a, 214b and a non-volatile memory (NVM) cell 216a, 216b connected to the respective transistor 214a, 214b.

A driver arrangement 210 may be provided. The driver arrangement 210 may be connected to or switchably connected to the first stage circuit 202 and the second stage circuit 204, as represented by the dashed line 201. The driver arrangement 210 may be a read/write driver arrangement for reading and writing operations.

In various embodiments, at (or during a duration of) a clock level of a clock signal (for example, received by the flip-flop circuit 200 or generated in the flip-flop circuit 200), the driver arrangement 210 may drive the first stage circuit 202 (and the first non-volatile memory cell 216a) in one of the two modes of operation to access the first non-volatile memory cell 216a (for example, via the first transistor 214a) and, at (or during a duration of) the clock level, the driver arrangement 210 may drive the second stage circuit 204 (and the second non-volatile memory cell 216b) in the other of the two modes of operation to access the second non-volatile memory cell 216b (for example, via the second transistor 214b). This may mean that at the same clock level (or at one clock level) or during a duration of the same clock level, the driver arrangement 210 may drive the first stage circuit 202 in one of the two modes of operation and the second stage circuit 204 in the other of the two modes of operation. In other words, the first stage circuit 202 (and the first non-volatile memory cell 216a) and the second stage circuit 204 (and the second non-volatile memory cell 216b) may be driven in different modes of operation at the same clock level or during (a duration of) the same clock level.

Therefore, in various embodiments, at any one time, the first stage circuit 202 (and the first non-volatile memory cell 216a) and the second stage circuit 204 (and the second non-volatile memory cell 216b) may be driven in different modes of operation. For example, at any one time, when the first stage circuit 202 (and the first non-volatile memory cell 216a) is driven in a first mode of operation, the second stage circuit 204 (and the second non-volatile memory cell 216b) is driven in a second mode of operation, and vice versa.

In various embodiments, the first transistor 214a may control access of the first non-volatile memory cell 216a by the driver arrangement 210. In other words, the driver arrangement 210 may access the first non-volatile memory cell 216a via the first transistor 214a, for example, when the first transistor 214a is activated or enabled. Similar descriptions apply to the second transistor 214b with respect to the second non-volatile memory cell 216b.

In the context of various embodiments, each of the first transistor 214a and the second transistor 214b may be a clamping transistor.

In the context of various embodiments, each of the first transistor 214a and the second transistor 214b may include a first source/drain terminal (S/D1), a second source/drain terminal (S/D2) and a gate terminal (G).

In various embodiments, a bias voltage, $V_{clamp}$, or a supply voltage, $V_{dd}$, ($V_{dd} > V_{clamp}$) may be supplied to the gate terminals of the first transistor 214a and the second transistor 214b depending on the mode of operation.

In various embodiments, the driver arrangement 210 may be coupled to the first source/drain terminals (e.g., drains) of the first transistor 214a and the second transistor 214b. The second source/drain terminal (e.g., source) of the first transistor 214a may be connected to one terminal of the first non-volatile memory cell 216a, with another terminal of the first non-volatile memory cell 216a connected to ground, while the second source/drain terminal (e.g., source) of the second transistor 214b may be connected to one terminal of the second non-volatile memory cell 216b, with another terminal of the second non-volatile memory cell 216b connected to ground.

In the context of various embodiments, the term "source/drain terminal" of a transistor may refer to a source terminal or a drain terminal. As the source terminal and the drain terminal of a transistor are generally fabricated such that these terminals are geometrically symmetrical, these terminals may be collectively referred to as source/drain terminals. In various embodiments, a particular source/drain terminal may be a "source" terminal or a "drain" terminal depending on the voltage to be applied to that terminal. Accordingly, the terms "first source/drain terminal" and "second source/drain terminal" may be interchangeable.

In the context of various embodiments, an output signal or information, Q, of the flip-flop circuit 200 may be obtained from the output of the second stage circuit 204. The output information may be outputted by the flip-flop circuit via an output terminal.

In the context of various embodiments, each of the first non-volatile memory cell 216a and the second non-volatile memory cell 216b may include a unipolar memory cell or a bipolar memory cell.

In the context of various embodiments, a unipolar memory cell may be set to different states, for example, by write currents flowing in one (single) direction (unidirectional).

In the context of various embodiments, a bipolar memory cell may be set to different states, for example, by write currents flowing in opposite directions (bidirectional). This may mean that a respective state of the bipolar memory cell may be set depending on the direction of the write current though the bipolar memory cell. In this regard, two write drivers (e.g., a bit line write driver and a source line write driver) may be required, one for each direction.

In the context of various embodiments, the term "clock level" may refer to a clock value or a clock phase. The clock level or the clock value or the clock phase may be part of or within a (single) clock period of a clock signal. As non-limiting examples, the clock level may be a "HIGH" level (e.g., representative of binary "1") or a "LOW" level (e.g., representative of binary "0").

In various embodiments, at different clock levels, each of the first stage circuit 202 (and the first non-volatile memory cell 216a) and the second stage circuit 204 (and the second non-volatile memory cell 216b) may be driven in different modes of operation, depending on the clock level. As non-limiting examples, at or during (a duration of) one clock level, the first stage circuit 202 (and the first non-volatile memory cell 216a) may be driven in a first mode of operation while the second stage circuit 204 (and the second non-volatile memory cell 216b) may be driven in a second mode of operation. At or during (a duration of) another (different) clock level, the first stage circuit 202 (and the first non-volatile memory cell 216a) may be driven in a second mode of operation while the second stage circuit 204 (and the second non-volatile memory cell 216b) may be driven in a first mode of operation.

In the context of various embodiments, the clock signal may have alternating "HIGH" and "LOW" levels. Each of the first stage circuit 202 and the second stage circuit 204 may be alternately driven in the two modes of operation, depending on the clock level. Further, as described above, the first stage circuit 202 and the second stage circuit 204, relative to each other, may be driven in different modes of operation at each "HIGH" level and each "LOW" level.

In the context of various embodiments, the term "access" may mean read and/or write.

In the context of various embodiments, the first non-volatile memory (NVM) cell 216a may be a master NVM cell and the second non-volatile memory (NVM) cell 216b may be a slave NVM cell.

In various embodiments, the first stage circuit 202 may further include a first buffer connected to the first transistor 214a, and wherein the second stage circuit 204 may further include a second buffer connected to the second transistor 214b. The first buffer may be connected to the first source/drain terminal (e.g., drain) of the first transistor 214a, and the second buffer may be connected to the first source/drain terminal (e.g., drain) of the second transistor 214b. An output signal of the flip-flop circuit 200 may be obtained from the output of the second buffer. In various embodiments, an output of the first buffer may be coupled to the driver arrangement 210 and/or to the second transistor 214b (e.g., to the first source/drain terminal (e.g., drain) of the second transistor 214b).

In the context of various embodiments, the two modes of operation may be a read mode and a write mode. For example, one of the two modes of operation (e.g., a first mode of operation) may be a read mode (or a write mode), while the other of the two modes of operation (e.g., a second mode of operation) may be a write mode (or a read mode. In this way, the driver arrangement 210 may act as a read/write driver arrangement.

In the context of various embodiments, the driver arrangement 210 may receive an input signal or information, D, for example via an input terminal of the flip-flop circuit 200. In various embodiments, information that is to be written to the first non-volatile memory cell 216a and the second non-volatile memory cell 216b may be provided to the driver arrangement 210.

In various embodiments, at (or during a duration of) the clock level, the driver arrangement 210 may be configured to drive the first stage circuit 202 in the read mode to read from the first non-volatile memory cell 216a information that is written into the first non-volatile memory cell 216a at (or during a duration of) a preceeding clock level and to drive the second stage circuit 204 in the write mode to write the information that is read (from the first non-volatile memory cell 216a) into the second non-volatile memory cell 216b. The preceeding clock level may be immediately preceeding the clock level. The preceeding clock level may be different from the clock level. For example, the preceeding clock level may be a "HIGH" level (or a "LOW" level) while the (current) clock level may be a "LOW" level (or a "HIGH" level).

In various embodiments, at (or during a duration of) the clock level, the driver arrangement 210 may be configured to drive the first stage circuit 202 in the write mode to write information into the first non-volatile memory cell 216a and to drive the second stage circuit 204 in the read mode to read from the second non-volatile memory cell 216b information that is written into the second non-volatile memory cell 216b at (or during a duration of) a preceeding clock level. The information read from the second non-volatile memory cell 216b may be outputted or provided as the output signal of the flip-flop circuit 200. The preceeding clock level may be immediately preceeding the clock level. The preceeding clock level may be different from the clock level. For example, the preceeding clock level may be a "LOW" level (or a "HIGH" level) while the (current) clock level may be a "HIGH" level (or a "LOW" level).

In various embodiments, the information read from the first non-volatile memory cell 216a may be provided to the first buffer, and/or the information read from the second non-volatile memory cell 216b may be provided to the second buffer.

In various embodiments, the first stage circuit 202 may be alternately driven in the read mode as described above, and in the write mode as described above, and the second stage circuit 204 may be alternately driven in the write mode as described above, and in the read mode as described above.

Therefore, at (or during a duration of) the (same) clock level, one of the first stage circuit 202 and the second stage circuit 204 may be in a read mode while the other of the first stage circuit 202 and the second stage circuit 204 may be in a write mode.

In various embodiments, by reading information from the first non-volatile memory cell 216a (where the information is previously written to the first non-volatile memory cell 216a) and writing the read information into the second non-volatile memory cell 216b, followed by subsequently reading the information written into the second non-volatile memory cell 216b as the output signal of the flip-flop circuit, a pipeline approach may be provided in various embodiments.

In various embodiments, the driver arrangement 210 may include a first read driver and a first write driver comprised in the first stage circuit 202 for accessing the first non-volatile memory cell 216a. The first read driver and the first write driver may be connected to or switchably connected to the first transistor 214a. The driver arrangement 210 may further include a second read driver and a second write driver comprised in the second stage circuit 204 for accessing the second non-volatile memory cell 216b. The second read driver and the second write driver may be connected to or switchably connected to the second transistor 214b. In various embodiments, an input signal or information, D, may be received by the first write driver. An output signal or information, Q, may be obtained from the output of the second buffer. In various embodiments, an output of the first buffer may be coupled to the driver arrangement 210 and/or to the second transistor 214b (e.g., to the first source/drain terminal (e.g., drain) of the second transistor 214b). For example, an output of the first buffer may be coupled to the second write driver.

In various embodiments, the flip-flop circuit 200 may further include a first multiplexer (MUX) and a second multiplexer (MUX). The driver arrangement 210 may include a read driver coupled to the first multiplexer, and a write driver coupled to the second multiplexer, wherein, at (or during a duration of) the clock level, the read driver may be configured to drive one of the first stage circuit 202 and the second stage circuit 204 in the read mode via the first multiplexer (for example, for reading information in the first non-volatile memory cell 216a or the second non-volatile memory cell 216b), and wherein, at (or during a duration of) the (same) clock level, the write driver may be configured to drive the other of the first stage circuit 202 and the second stage circuit 204 in the write mode via the second multiplexer (for example, for writing information to the first non-volatile memory cell 216a or the second non-volatile memory cell 216b). The read driver and the write driver may be shared by the first stage circuit 202 and the second stage circuit 204.

In various embodiments, an input signal or information, D, may be received by the write driver. An output signal or information, Q, may be obtained from the output of the second buffer. In various embodiments, an output of the first buffer may be coupled to the driver arrangement 210 and/or to the second transistor 214b (e.g., to the first source/drain terminal (e.g., drain) of the second transistor 214b). For example, an output of the first buffer may be coupled to the write driver.

In various embodiments, at (or during a duration of) the (same) clock level, the first multiplexer may be configured to connect the read driver to one of the first stage circuit 202 and the second stage circuit 204, while the second multiplexer may be configured to connect the write driver to the other of the first stage circuit 202 and the second stage circuit 204.

In various embodiments, at (or during a duration of) the (same) clock level, the first multiplexer may connect the read driver to the first non-volatile memory cell 216a or to the second non-volatile memory cell 216b, while the second multiplexer may connect the write driver to the first non-volatile memory cell 216a when the first multiplexer connects the read driver to the second non-volatile memory cell 216b or the second multiplexer may connect the write driver to the second non-volatile memory cell 216b when the first multiplexer connects the read driver to the first non-volatile memory cell 216a.

In various embodiments, the first multiplexer may be part of the first stage circuit 202, and the second multiplexer may be part of the second stage circuit 204.

In various embodiments, the write driver may include a tri-state buffer.

In the context of various embodiments, a tri-state buffer may include an input terminal, a control input terminal and an output terminal. The control input terminal may receive an enabling signal. When the tri-state buffer is active or enabled, the output signal is the same as the input signal.

In various embodiments, the flip-flop circuit 200 may further include a first multiplexer (MUX), a second multiplexer (MUX), a third multiplexer (MUX) and a fourth multiplexer (MUX), wherein the third multiplexer is coupled to ground. The driver arrangement 210 may include a read driver coupled to the first multiplexer, a bit line (BL) write driver coupled to the second multiplexer, and a source line (SL) write driver coupled to the fourth multiplexer, wherein, at (or during a duration of) the clock level, the read driver may be configured to drive one of the first stage circuit 202 and the second stage circuit 204 in the read mode via the first multiplexer (for example, for reading information in the first non-volatile memory cell 216a or the second non-volatile memory cell 216b), and wherein the one of the first stage circuit 202 and the second stage circuit 204 may be further connected to the third multiplexer, and wherein, at (or during a duration of) the (same) clock level and depending on a value of information to be written, the bit line write driver may be configured to drive the other of the first stage circuit 202 and the second stage circuit 204 in the write mode via the second multiplexer (for example, for writing information to the first non-volatile memory cell 216a or the second non-volatile memory cell 216b) or the source line write driver may be configured to drive the other of the first stage circuit 202 and the second stage circuit 204 in the write mode via the fourth multiplexer (for example, for writing information to the first non-volatile memory cell 216a or the second non-volatile memory cell 216b). At any one time, the bit line write driver or the source line write driver may be activated. The read driver, the bit line write driver and the source line write driver may be shared by the first stage circuit 202 and the second stage circuit 204. Each of the first non-volatile memory cell 216a and the second non-volatile memory cell 216b may be or may include a bipolar memory cell.

In various embodiments, an input signal or information, D, may be received by the bit line (BL) write driver, and a complementary input signal or information, Db, may be received by the source line (SL) write driver. An output signal or information, Q, may be obtained from the output of the second buffer. In various embodiments, an output of the first buffer may be coupled to the driver arrangement 210 and/or to the second transistor 214b (e.g., to the first source/drain terminal (e.g., drain) of the second transistor 214b). For example, an output of the first buffer may be coupled to the bit line (BL) write driver.

In the context of various embodiments, a non-volatile memory cell may be connected between a bit line (BL) and a source line (SL). This may mean that one terminal of the non-volatile memory cell may be connected to the bit line, while another terminal of the non-volatile memory cell may be connected to the source line. The bit line write driver may be coupled to the bit line to drive the non-volatile memory cell from the bit line side of the non-volatile memory cell, while the source line write driver may be coupled to the source line to drive the non-volatile memory cell from the source line side of the non-volatile memory cell.

In various embodiments, at (or during a duration of) the (same) clock level, the first multiplexer may be configured to connect the read driver to one of the first stage circuit 202 and the second stage circuit 204, while the second multiplexer may be configured to connect the bit line write driver or the fourth multiplexer may be configured to connect the source line write driver to the other of the first stage circuit 202 and the second stage circuit 204, depending on a value of information to be written. In various embodiments, by providing the bit line write driver and the source line write driver, bi-directional write currents may be provided.

In various embodiments, at (or during a duration of) the (same) clock level, the first multiplexer may connect the read driver to the first non-volatile memory cell 216a or to the second non-volatile memory cell 216b, while the second multiplexer may connect the bit line write driver or the fourth multiplexer may be configured to connect the source line write driver to the first non-volatile memory cell 216a when the first multiplexer connects the read driver to the second non-volatile memory cell 216b, or the second multiplexer may connect the bit line write driver or the fourth multiplexer may be configured to connect the source line write driver to the second non-volatile memory cell 216b when the first multiplexer connects the read driver to the first non-volatile memory cell 216a.

In various embodiments, the first multiplexer may be part of the first stage circuit, while the second multiplexer and the fourth multiplexer may be part of the second stage circuit.

In various embodiments, each of the bit line write driver and the source line write driver may include a tri-state buffer.

In various embodiments, the flip-flop circuit 200 may further include a reference circuit configured to generate at least one reference current to be supplied to the first stage circuit 202 and the second stage circuit 204. The reference circuit may be electrically coupled to the first stage circuit 202 and the second stage circuit 204. In various embodiments, a respective value of information in the first non-volatile memory cell 216a and the second non-volatile memory cell 216b may be determined based on a value of the at least one reference current, for example, by comparison of a value of the read current provided to the first non-volatile memory cell 216a and the second non-volatile memory cell 216b with the value of the at least one reference current.

In various embodiments, the reference circuit may be a mid-point reference circuit. For example, the reference circuit may generate a first (high) reference current (e.g., refh) and a second (low) reference current (e.g., refl), which may be averaged to provide a mid-point reference current.

In the context of various embodiments, each of the first non-volatile memory cell 216a and the second non-volatile memory cell 216b may include a resistive memory cell. The resistive memory cell may be or may include a magnetic tunnel junction (MTJ) cell or a spin-transfer torque random access memory (STT-MRAM).

In the context of various embodiments, the read driver may be a current mirror load.

In the context of various embodiments, the flip-flop circuit 200 may be a non-volatile flip-flop circuit (nvFF).

Figure 2B:
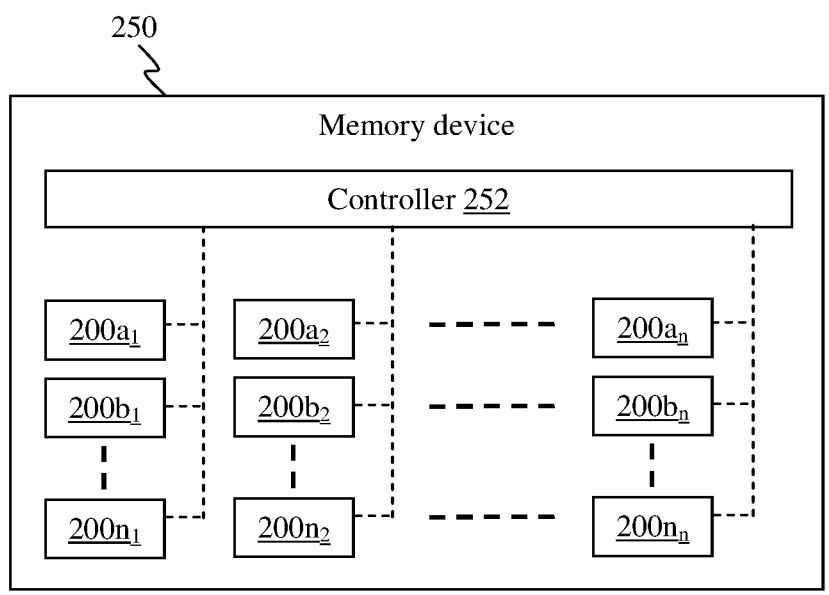
FIG. 2B shows a schematic cross-sectional view of a memory device, according to various embodiments.

FIG. 2B shows a schematic cross-sectional view of a memory device 250, according to various embodiments. The memory device 250 includes a plurality of flip-flop circuits $200a_1$, $200a_2$, . . . , $200a_n$, $200b_1$, $200b_2$, $200b_n$, $200n_1$, $200n_2$, . . . , $200n_n$, wherein each flip-flop circuit of the plurality of flip-flop circuits $200a_1$, $200a_2$, . . . , $200a_n$, $200b_1$, $200b_2$, . . . , $200b_n$, $200n_1$, $200n_2$, . . . , $200n_n$ is as described in the context of the flip-flop circuit 200 of the embodiment shown in FIG. 2A, and a controller 252 configured to control operation of the plurality of flip-flop circuits $200a_1$, $200a_2$, . . . , $200a_n$, $200b_1$, $200b_2$, . . . , $200b_n$, $200n_1$, $200n_2$, $200n_n$. The controller 252 may be connected to or switchably connected to the plurality of flip-flop circuits $200a_1$, $200a_2$, . . . , $200a_n$, $200b_1$, $200b_2$, . . . , $200b_n$, $200n_1$, $200n_2$, . . . , $200n_n$.

In various embodiments, the plurality of flip-flop circuits $200a_1$, $200a_2$, . . . , $200a_n$, $200b_1$, $200b_2$, . . . , $200b_n$, $200n_1$, $200n_2$, . . . , $200n_n$ may be connected (e.g., electrically and/or mechanically connected) to each other.

In various embodiments, the plurality of flip-flop circuits $200a_1$, $200a_2$, . . . , $200a_n$, $200b_1$, $200b_2$, . . . , $200b_n$, $200n_1$, $200n_2$, . . . , $200n_n$ may be arranged in rows and columns.

In various embodiments, the controller 252 may be configured to generate address values for accessing the plurality of flip-flop circuits $200a_1$, $200a_2$, . . . , $200a_n$, $200b_1$, $200b_2$, . . . , $200b_n$, $200n_1$, $200n_2$, . . . , $200n_n$. As a non-limiting example, the memory device 250 may be or may include a first-in-first-out (FIFO) register.

In various embodiments, the controller 252 may be configured to receive an address value and to determine whether the address value is present or absent in the controller 252, and if the address value is present, the controller 252 may be further configured to access the flip-flop circuit of the plurality of flip-flop circuits $200a_1$, $200a_2$, . . . , $200a_n$, $200b_1$, $200b_2$, . . . , $200b_n$, $200n_1$, $200n_2$, . . . , $200n_n$ corresponding to the address value. As a non-limiting example, the memory device 250 may be or may include a cache (e.g., L1 cache).

In the context of various embodiments, the memory device 250 may be a non-volatile memory device.

Figure 2C:
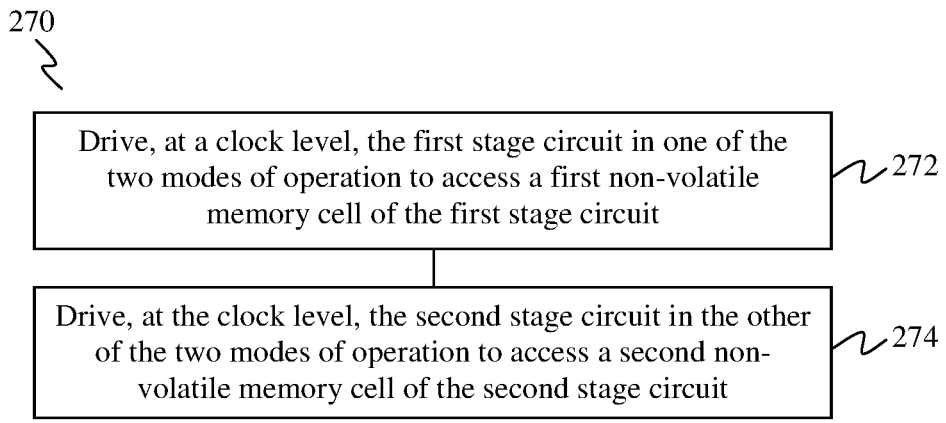
FIG. 2C shows a flow chart illustrating a method of controlling a flip-flop circuit, according to various embodiments.

FIG. 2C shows a flow chart 270 illustrating a method of controlling a flip-flop circuit, according to various embodiments. The flip-flop circuit includes a first stage circuit and a second stage circuit, wherein each of the first stage circuit and the second stage circuit is operable in two modes of operation. In various embodiments, the flip-flop circuit may be as described in the context of the flip-flop circuit 200 of the embodiment shown in FIG. 2A.

At 272, at a clock level (of a clock signal), the first stage circuit may be driven in one of the two modes of operation to access a first non-volatile memory cell of the first stage circuit. The first non-volatile memory cell may be accessed via a first transistor provided in the first stage circuit and connected to the first non-volatile memory cell.

At 274, at the clock level (of the clock signal), the second stage circuit may be driven in the other of the two modes of operation to access a second non-volatile memory cell of the second stage circuit. The second non-volatile memory cell may be accessed via a second transistor provided in the second stage circuit and connected to the second non-volatile memory cell.

In various embodiments, the two modes of operation may be a read mode and a write mode.

In various embodiments, at 272, at the clock level, the first stage circuit may be driven in the read mode to read from the first non-volatile memory cell information that is written into the first non-volatile memory cell at a preceeding clock level, and, at 274, at the clock level, the second stage circuit may be driven in the write mode to write the information that is read into the second non-volatile memory cell.

In various embodiments, at 272, at the clock level, the first stage circuit may be driven in the write mode to write information into the first non-volatile memory cell, and, at 274, at the clock level, the second stage circuit may be driven in the read mode to read from the second non-volatile memory cell information that is written into the second non-volatile memory cell at a preceeding clock level.

Figure 3A:
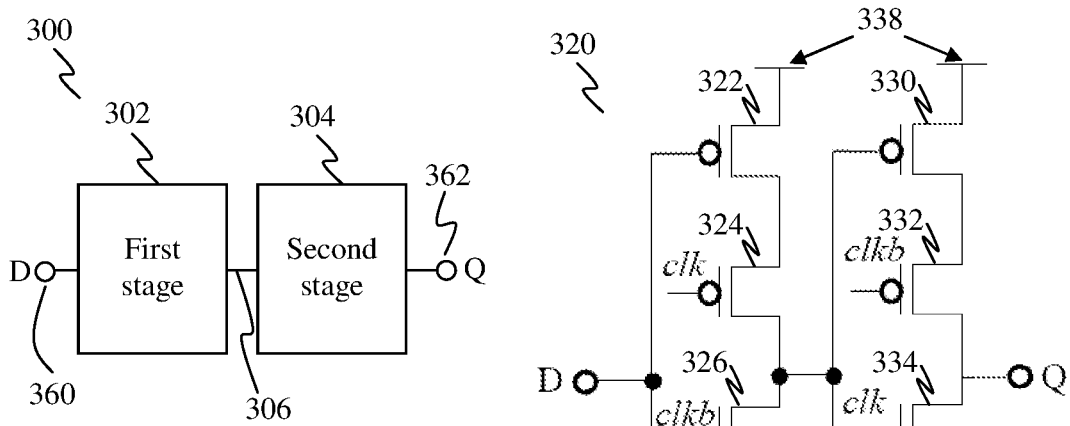
FIG. 3A shows a schematic diagram illustrating a flip-flop circuit, in accordance with various embodiments.

FIG. 3A shows a schematic diagram illustrating a flip-flop circuit (e.g., a dynamic flip-flop) 300, in accordance with various embodiments. As seen in FIG. 3A, the dynamic flip-flop 300 includes a first stage circuit 302 and a second stage circuit 304, where the first stage circuit 302 and the second stage circuit 304 may be coupled to each other via a link 306. The link 306 may be an electrical connection and/or a physical connection. An input (e.g., signal or data or information), D, may be entered to the first stage circuit 302 at an input terminal 360 while and an output (e.g., signal or data or information), Q, may emerge from the second stage circuit 304 at an output terminal 362. Each of the first stage circuit 302 and a second stage circuit 304 may include a transistor and a non-volatile memory cell. The flip-flop circuit 300 may be as described in the context of the flip-flop circuit 200 of the embodiment shown in FIG. 2A or in the context of the embodiments shown in FIGS. 4, 5, 6A to 6G to be described later below.

Figure 3B:
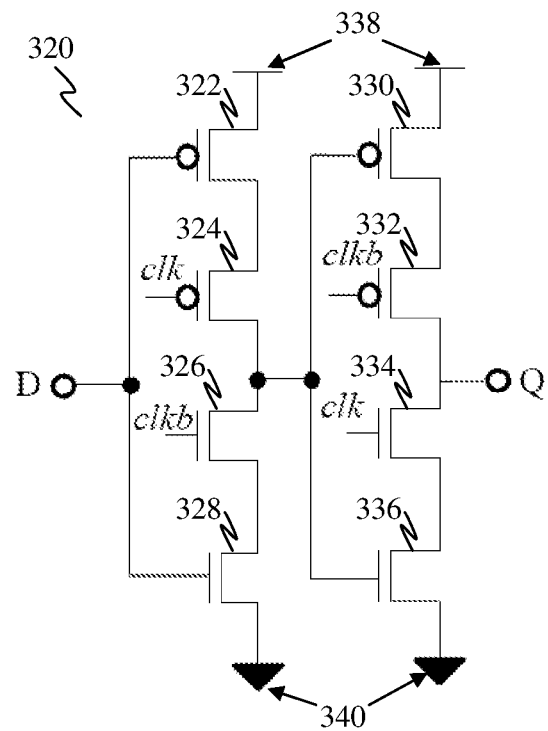
FIG. 3B shows a circuit representation of a conventional volatile dynamic D-type flip-flop (DFF).

FIG. 3B shows a circuit representation 320 of a conventional volatile dynamic D-type flip-flop (DFF). In the case of the volatile dynamic DFF, four transistors 322, 324, 326, 328 are connected in series and another four transistors 330, 332, 334, 336 are connected in series. The transistors 322, 330 (e.g., a p-type metal-oxide-semiconductor field-effect transistor (MOSFET)) have their respective source terminals coupled to a voltage supply 338. The transistors 328, 336 (e.g., an n-type metal-oxide-semiconductor field-effect transistor (MOSFET)) have their respective source terminals coupled to ground 340. Gate terminals of the transistors 322, 328 are configured to receive an input, D. Gate terminals of the transistors 330, 336 are connected together to a node in between the transistors 324, 326. An output, Q, may be obtained from a node between the transistors 332, 334. A clock signal (clk) is provided to the gate terminals of the transistors 324, 334, while a complementary clock signal (clkb) (i.e. clkb is an inverted version of clk) is provided to the gate terminals of the transistors 326, 332.

Various embodiments may provide a non-volatile flip-flop based on a dynamic flip-flop (e.g., the dynamic flip-flop 300), which has a higher speed than a latch-based differential flip-flop. A faster switching speed may be due to a smaller parasitic capacitance as there may be fewer (less number of) transistors' parasitics. The switching speed ($\tau$) may be determined by a product of a resistance (R) of the transistor and the parasitic capacitance (C), in other words, $\tau = R \times C$. A reduced power consumption may also be due to the smaller parasitic capacitance since power consumption may be determined by $f \times C \times V^2$, where "f" is a frequency of the clocked operation of the flip-flop.

Figure 4:
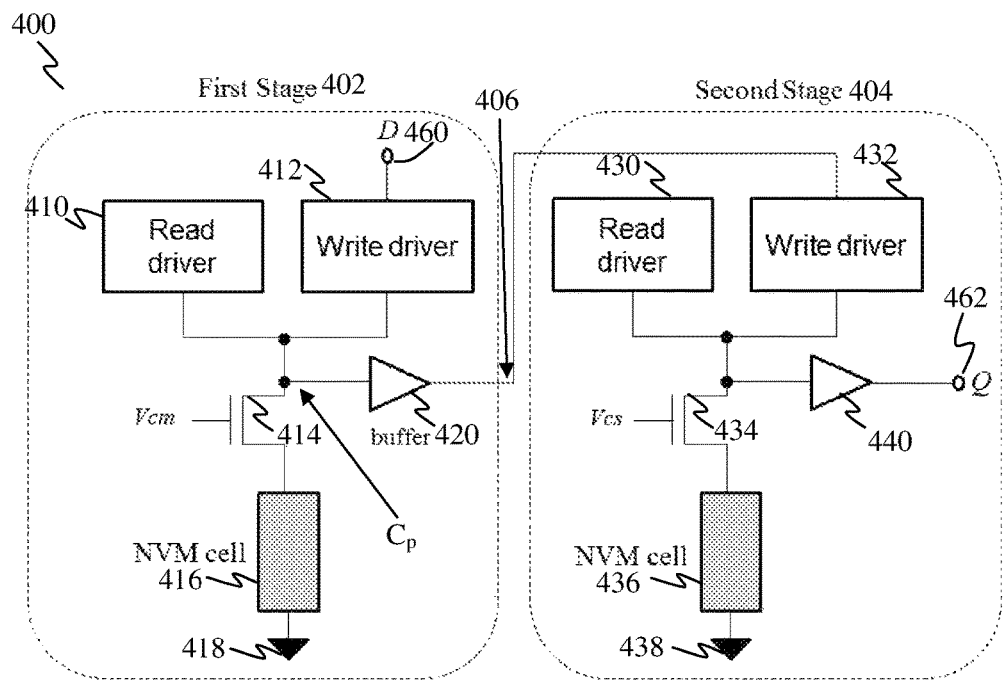
FIG. 4 shows a schematic diagram depicting a flip-flop circuit, in accordance with various embodiments.

FIG. 4 shows a schematic diagram depicting a flip-flop circuit (e.g., a dynamic non-volatile flip-flop) 400, in accordance with various embodiments, illustrating a dynamic two-stage-pipeline based resistive non-volatile flip-flop without resource sharing. For example, the flip-flop circuit 400 may be a dynamic unipolar resistive non-volatile flip-flop. In various embodiments, the flip-flop circuit 400 may be a dynamic non-volatile D-type flip-flop (DFF) which is unipolar and has no resource-sharing capability.

The flip-flop circuit 400 may include or consist of two stages: a first stage circuit 402 and a second stage circuit 404. Each of the first stage circuit 402 and the second stage circuit 404 may include a respective write driver 412, 432, a respective read driver 410, 430, a respective transistor (e.g., clamping transistor) 414, 434 and a respective non-volatile memory (NVM) cell (e.g., a resistive NVM cell) 416, 436. The write drivers 412, 432, and the read drivers 410, 430 form a driver arrangement that may drive the first stage circuit 402 and the second stage circuit 404 in different modes of operation as described above.

For each of the first stage circuit 402 and the second stage circuit 404, the respective write driver 412, 432 and the respective read driver 410, 430 may be connected to a drain terminal of the respective clamping transistor 414, 434. Gate terminals of the respective clamping transistor 414, 434 may be connected to a bias voltage, $V_{cm}$ or $V_{cs}$. Each of the bias voltages, $V_{cm}$, $V_{cs}$, may be a clamping voltage, $V_{clamp}$, or a supply voltage, $V_{dd}$. For example, $V_{cm}$ may be a clamping voltage, $V_{clamp}$, and $V_{cs}$ may be a supply voltage, $V_{dd}$, or vice versa, depending on the mode of operation (i.e. read or write) of the first stage circuit 402 and the second stage circuit 404. A source terminal of the transistor 414, 434 may be connected to one terminal of the respective resistive NVM cell 416, 436. The other terminal of the resistive NVM cells 416, 436 may be connected to ground 418, 438. There may be a respective buffer 420, 440 connected to the respective drain terminal of the respective transistor 414, 434, which functions like a sense amplifier to generate an output logic.

An input (e.g., signal or data or information), D, may be entered to an input terminal 460 while an output (e.g., signal or data or information), Q, may emerge or may be provided from an output terminal 462. The input, D, may be provided to the write driver 412. The output of the buffer 420 of the first stage circuit 402 may be coupled to the drain terminal of the clamping transistor 434 of the second stage 404 through the write driver 432 in the second stage circuit 404 (via a connection 406). In this way, information read from the NVM cell 416 may be stored in the buffer 420 and then written via the write driver 432 to the NVM cell 436.

While not shown, it should be appreciated that the write driver 412 and the read driver 430 may receive a clock signal clk, and the write driver 432 and the read driver 410 may receive a complementary clock signal clkb.

In the flip-flop circuit 400 of FIG. 4, there may be a reduced parasitic capacitance, $C_p$, which may include the capacitance of five transistors (e.g., three transistors (one clamping transistor 414, one read driver 410 and one write driver 412), and a buffer 420 input (two transistors)). In other words, the reduced parasitic capacitance includes: 3 transistors (1 clamp transistor+1 read driver+1 write driver)+buffer input (2 transistors)⇒ total: 5 transistors.

Figure 5:
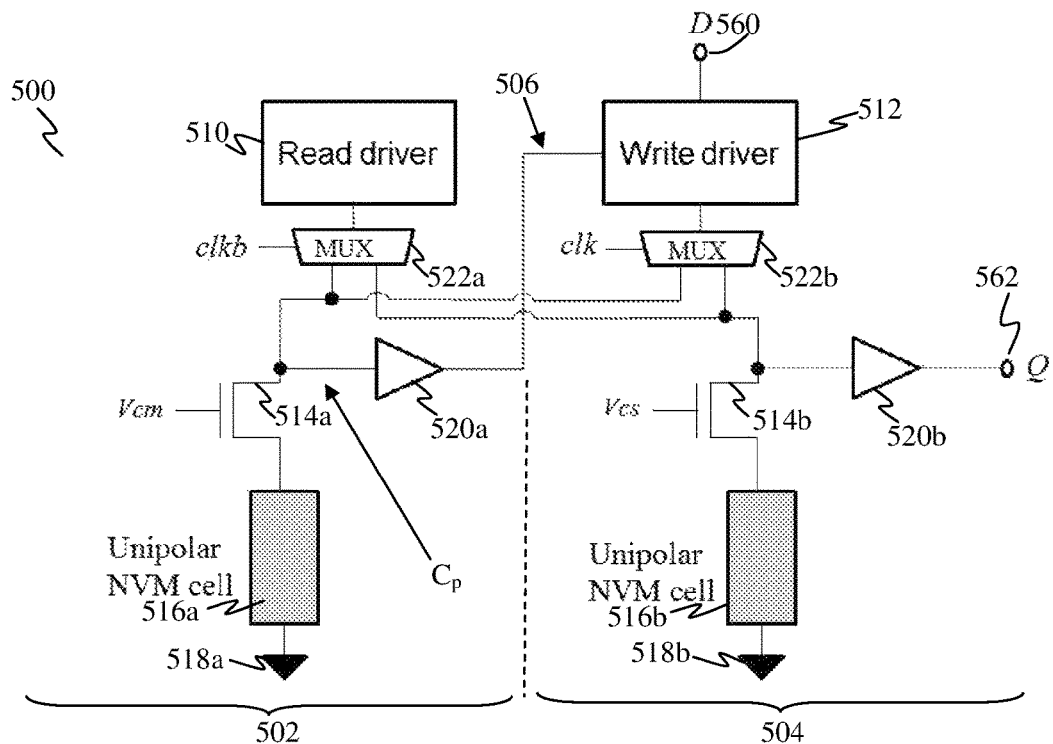
FIG. 5 shows a schematic diagram depicting a flip-flop circuit, in accordance with various embodiments.

FIG. 5 shows a schematic diagram depicting a flip-flop circuit (e.g., a dynamic non-volatile flip-flop) 500, in accordance with various embodiments, illustrating a dynamic two-stage pipeline based resistive unipolar non-volatile flip-flop with shared write driver and shared read driver. For example, the flip-flop circuit 500 may be a dynamic unipolar resistive non-volatile flip-flop. In various embodiments, the flip-flop circuit 500 may be a dynamic non-volatile DFF which is unipolar and has resource-sharing capability. The flip-flop circuit 500 of FIG. 5 may be similar to the flip-flop circuit 400 of FIG. 4, however the concept of resource sharing may be applied to the flip-flop circuit 500.

In the flip-flop circuit 500, a write driver 512 and a read driver 510 may be multiplexed (using multiplexers (MUXs) that may be controlled by the clk signal or the complementary clkb signal, e.g., a first multiplexer 522a and a second multiplexer 522b) to the first and second stage circuits 502, 504. A first output from the respective MUX 522a, 522b may be coupled to the drain terminal of the clamping transistor 514a of the first stage circuit 502, while a second output from the respective MUX 522a, 522b may be coupled to the drain terminal of the clamping transistor 514b of the second stage circuit 504. Depending on the clock level of the clk signal (and also the complementary clkb signal), the write driver 512 may be connected to the first output (or second output) of the MUX 522b, while the read driver 510 may be connected to the second output (or first output) of the MUX 522a. Gate terminals of the respective clamping transistor 514a, 514b may be connected to a bias voltage, $V_{cm}$ or $V_{cs}$. Each of the bias voltages, $V_{cm}$, $V_{cs}$, may be a clamping voltage, $V_{clamp}$, or a supply voltage, $V_{dd}$. For example, $V_{cm}$ may be a clamping voltage, $V_{clamp}$, and $V_{cs}$ may be a supply voltage, $V_{dd}$, or vice versa, depending on the mode of operation (i.e. read or write) of the first stage circuit 502 and the second stage circuit 504. The source terminal of the transistor 514a, 514b may be connected to one terminal of the respective NVM cell (or unipolar NVM cell) 516a, 516b. The other terminal of the NVM cell 516a, 516b may be connected to ground 518a, 518b. There may be a buffer 520a, 520b connected to the respective drain terminal of the respective transistor 514a, 514b.

An input (e.g., signal or data or information), D, may be entered to an input terminal 560 while an output (e.g., signal or data or information), Q, may emerge or may be provided from an output terminal 562. The write driver 512 may receive the input D to be written. The output of the buffer 520a (via a connection 506) may be coupled to the drain terminal of the clamping transistor 514b through the write driver 512 and the MUX 522b. In this way, information read from the NVM cell 516a may be stored in the buffer 520a and then written via the write driver 512 to the NVM cell 516b.

In the flip-flop circuit 500 of FIG. 5, there may be a reduced parasitic capacitance, $C_p$, which may include the capacitance of five transistors (e.g., three transistors (one clamping transistor 514a, two MUXs 522a, 522b), and a buffer 520a input (two transistors)). In other words, the parasitic capacitance includes: 3 transistors (1 clamp transistor+2 MUXs)+buffer input (2 transistors)⇒ total: 5 transistors.

The write driver 512 and the read driver 510 form a driver arrangement that may drive the first stage circuit 502 and the second stage circuit 504 in different modes of operation as described above. In various embodiments, at different clock levels or clock phases, the write driver 512 and the read driver 510 may be connected to different stage circuits 502, 504. For example, when the clock (clk) level is low (e.g., logic 0) (and therefore clkb level is high), the write driver 512 may be connected to the first stage circuit 502 and the read driver 510 may be connected to the second stage circuit 504. On the other hand, when the clock (clk) level is high (e.g., logic 1) (and therefore clkb level is low), the read driver 510 may be connected to the first stage circuit 502 and the write driver 512 may be connected to the second stage circuit 504. By sharing the read driver 510 and the write driver 512, the area of the non-volatile flip-flop 500 (or nvDFF) may be reduced.

Figure 6A:
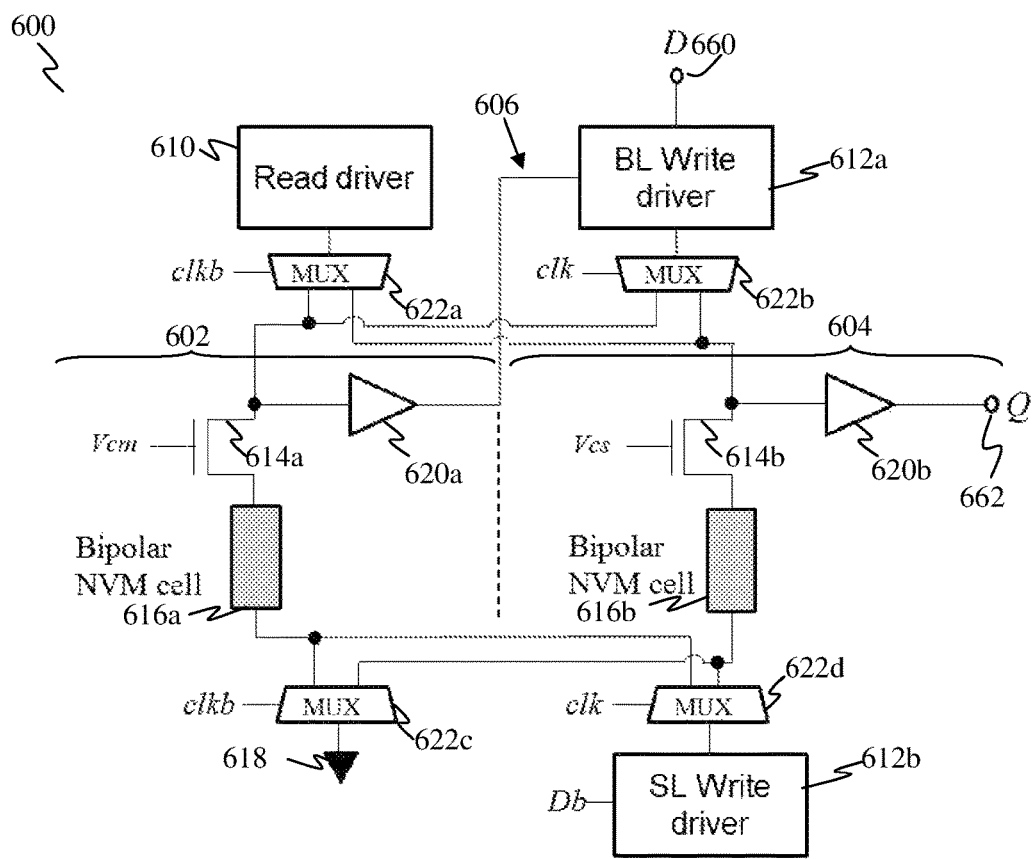
FIG. 6A shows a schematic diagram depicting a flip-flop circuit, in accordance with various embodiments.

FIG. 6A shows a schematic diagram depicting a flip-flop circuit (e.g., a dynamic non-volatile flip-flop) 600, in accordance with various embodiments, illustrating a dynamic two-stage-pipeline based resistive bipolar non-volatile flip-flop with shared write driver and shared read driver. For example, the flip-flop circuit 600 may be a dynamic bipolar resistive non-volatile flip-flop. In various embodiments, the flip-flop circuit 600 may be a dynamic non-volatile DFF which is bipolar and has resource-sharing capability.

A bipolar resistive non-volatile flip-flop (e.g., the flip-flop circuit 600) may be set to different resistive states by flowing the write current in opposite directions. Two write drivers (e.g., a bitline (BL) write driver 612a and a source line (SL) write driver 612b) may be required, one for each direction. The write drivers 612a, 612b and a read driver 610 may be multiplexed (using multiplexers (MUXs) (e.g., a second multiplexer 622b and a fourth multiplexer 622d) that may be controlled by the clk signal, and a MUX (e.g., a first multiplexer 622a) that may be controlled by the complementary clkb signal) to achieve resource sharing. A first output from the respective MUX 622a, 622b may be coupled to the drain terminal of a clamping transistor 614a of the first stage circuit 602, while a second output from the respective MUX 622a, 622b may be coupled to the drain terminal of a clamping transistor 614b of the second stage circuit 604. Gate terminals of the respective clamping transistor 614a, 614b may be connected to a bias voltage, $V_{cm}$ or $V_{cs}$. Each of the bias voltages, $V_{cm}$, $V_{cs}$, may be a clamping voltage, $V_{clamp}$, or a supply voltage, $V_{dd}$. For example, $V_{cm}$, may be a clamping voltage, $V_{clamp}$, and $V_{cs}$ may be a supply voltage, $V_{dd}$, or vice versa, depending on the mode of operation (i.e. read or write) of the first stage circuit 602 and the second stage circuit 604. The source terminal of the transistor 614a, 614b may be connected to one terminal of the respective NVM cell (or bipolar NVM cell) 616a, 616b. The other terminal of the NVM cell 616a may be connected to a first output of a MUX 622c and a first output of the MUX 622d, while the other terminal of the NVM cell 616b may be connected to a second output of the MUX 622c and a second output of the MUX 622d. The MUX 622c may be controlled by the clkb signal. Another terminal of the MUX 622c may be coupled to a ground 618. There may be a buffer 620a, 620b connected to the respective drain terminal of the respective transistor 614a, 614b.

An input (e.g., signal or data or information), D, may be entered to an input terminal 660 while an output (e.g., signal or data or information), Q, may emerge or may be provided from an output terminal 662. The BL write driver 612a may receive D and the SL write driver 612b may receive Db, where Db may be an inverted D (i.e., Db is complementary to D). The output of the buffer 620a (via a connection 606) may be coupled to the drain terminal of the clamping transistor 614b through the BL write driver 612a and the MUX 622b.

As may be observed in FIG. 6A, the bitline (BL) write driver 612a and the source line (SL) write driver 612b may be shared. The read driver 610, the bitline (BL) write driver 612a and the source line (SL) write driver 612b form a driver arrangement that may drive the first stage circuit 602 and the second stage circuit 604 in different modes of operation as described above. Depending on the clock level of the clk signal (and also the complementary clkb signal), the bitline (BL) write driver 612a may be connected to the first output (or second output) of the MUX 622b and/or the source line (SL) write driver 612b may be connected to the first output (or second output) of the MUX 622d, while the read driver 610 may be connected to the second output (or first output) of the MUX 622a and the MUX 622c may be connected to the NVM cell 616b (or the the NVM cell 616a). Further, for example, when D=1 and Db=0, the bitline (BL) write driver 612a may be enabled to provide a write current in a first direction, and when D=0 and Db=1, the source line (SL) write driver 612b may be enabled to provide a write currentin a second (opposite) direction.

Figure 6B:
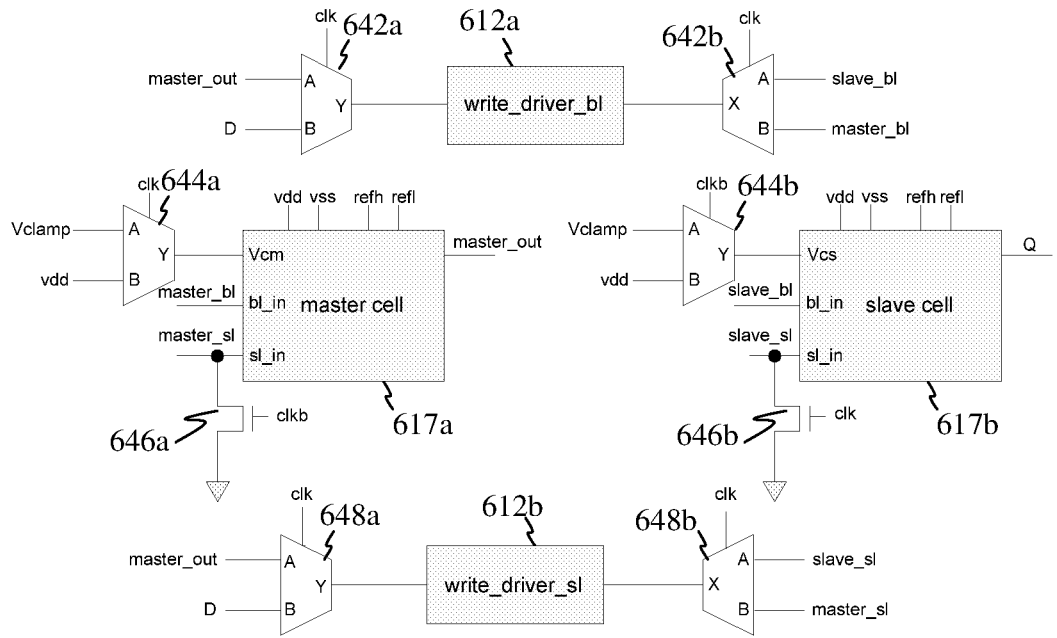
FIG. 6B shows a realization of the flip-flop circuit of FIG. 6A.

FIG. 6B shows a realization of the flip-flop 600 of FIG. 6A, which may be an implementation of the resistive bipolar non-volatile flip-flop with shared write driver and shared read driver. In this realization, there is a bipolar non-volatile flip-flop with write drivers sharing. For bipolar switching, two write drivers may be required, one as the bitline (BL) write driver 612a, and the other as the source line (SL) write driver 612b. The bitline (BL) write driver 612a may be coupled to multiplexers (MUXs) 642a, 642b which may be controlled by the clk signal. The source line (SL) write driver 612b may be coupled to MUXs 648a, 648b which may be controlled by the clk signal. The two write drivers 612a, 612b may be connected to the first and second stage circuits (c.f., 602, 604 of FIG. 6A) of the flip-flop 600 at different clock phases. Therefore, the two write drivers 612a, 612b may be shared by the first and second stage circuits. In FIG. 6B, a master cell 617a is shown to represent the first stage circuit 602 (FIG. 6A), and a slave cell 617b is shown to represent the second stage circuit 604 (FIG. 6A). Each of the master cell 617a and the slave cell 617b may include a non-volatile memory (NVM) cell, a buffer and a clamping transistor. The master cell 617a and the slave cell 617b may be identical in a basic flip-flop application.

As non-limiting examples, when the clock level is low (e.g., logic 0), the write drivers 612a, 612b may be connected to the first stage circuit 602 (master cell 617a), and when the clock level is high (e.g., logic 1), the write drivers 612a, 612b may be connected to the second stage circuit 604 (slave cell 617b). The write operation of the second stage circuit 604 may terminate when the clock level switches from high to low. This represents the operation of a negative-edge triggered DFF. If the process is switched, i.e. when the clock level is high, the write drivers 612a, 612b may be connected to the first stage circuit 602 and when the clock level is low, the write drivers 612a, 612b may be connected to the second stage circuit 604. This represents a positive-edge triggered DFF.

The gate voltage of the clamping transistor (e.g., 614a, 614b of FIG. 6A) may be connected to $V_{clamp}$ when the the particular stage circuit is in read operation (not in write operation) and connected to a higher voltage, e.g., $V_{dd}$ (supply voltage), when the particular stage circuit is in write operation. Thus, the read voltage or $V_{clamp}$ driver, may be also shared between the first and the second stage circuits 602, 604 of the flip-flop circuit 600 with a multiplexer. For example, a MUX 644a may be coupled to the master cell 617a for multiplexing $V_{clamp}$ or $V_{dd}$ to an input terminal labelled as "Vcm" of the master cell 617a. The MUX 644a may be controlled by the clk signal. The clkb signal may trigger the master cell 617a via a transistor 646a. A MUX 644b may be coupled to the slave cell 617b for multiplexing $V_{clamp}$ or $V_{dd}$ to an input terminal labelled as 'Vcs' of the slave cell 617b. The MUX 644b may be controlled by the clkb signal. The clk signal may trigger the slave cell 617b via a transistor 646b.

Figure 6C:
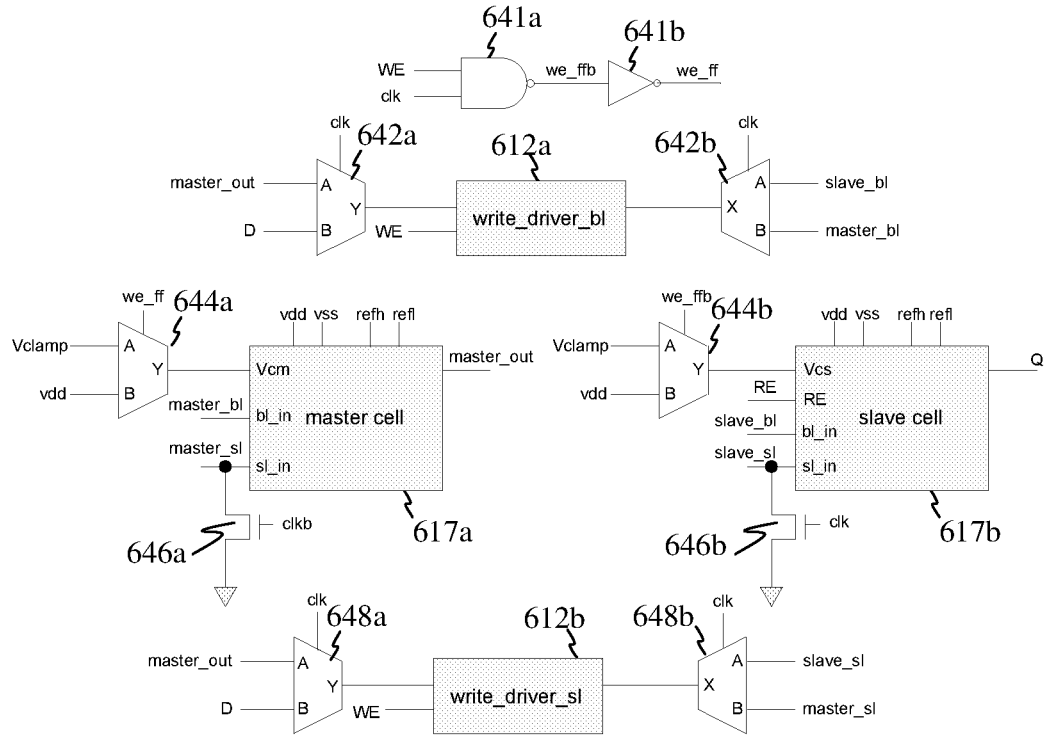
FIG. 6C shows a realization of the flip-flop circuit of FIG. 6A, illustrating an implementation of a resistive bipolar non-volatile flip-flop with shared write driver and shared read driver in an application of a first-in-first-out (FIFO) register file, in accordance with various embodiments.

FIG. 6C shows a realization of the flip-flop 600 of FIG. 6A, which may be an implementation of the resistive bipolar non-volatile flip-flop with shared write driver and shared read driver in an application of a first-in-first-out (FIFO) register file. The realization of FIG. 6C may provide the write drivers sharing and control signals when the bipolar non-volatile flip-flop is used in the application of the FIFO register file. Global write enable (WE) and read enable (RE) signals may indicate the operation phases of the FIFO. The WE and RE signals may further control the operations of the master and slave cells (e.g., 617a, 617b) through the clock signals. The components and connections for the realization of FIG. 6C are generally similar to that of FIG. 6B, with the following differences. For example, both the bitline (BL) write driver 612a and the source line (SL) write driver 612b may be triggered by the WE signal. The slave cell 617b may receive the RE signal. Instead of using the clk signal and the clkb signal directly (as in FIG. 6B), the MUXs 644a, 644b may be controlled by respective we_ff signal and we_ffb signal that may be provided by subjecting the WE signal and the clk signal through a logic NAND gate 641a to obtain the we_ffb signal that may be in turn inverted by an inverter 641b to obtain the we_ff signal.

In FIGS. 6B and 6C, nodes, inputs or outputs indicated with the same signal (or parameter) may indicate that the same signal may be provided to the nodes, inputs or outputs, or that a connection may be provided between the nodes or between an input and an output for propagation/transfer of the signal from one node (or input) to the other node (or output).

Figure 6D:
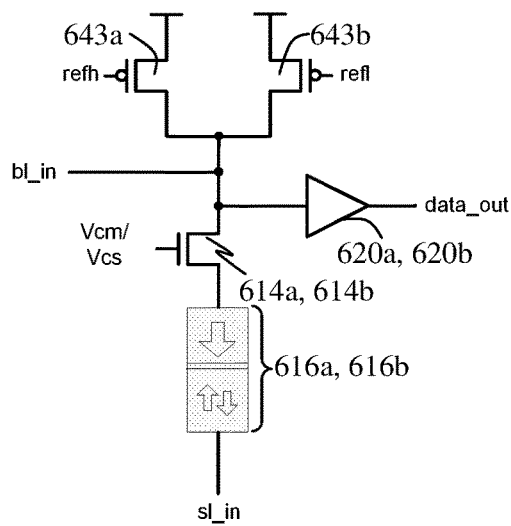
FIG. 6D shows a schematic diagram illustrating a realization of master and slave cells of a resistive bipolar non-volatile flip-flop, in accordance with various embodiments.

FIG. 6D shows a schematic diagram illustrating a realization of the master and slave cells (e.g., 617a, 617b, FIG. 6B) in the bipolar non-volatile flip-flop of various embodiments. For example, FIG. 6D may refer to the master cell 617a and slave cell 617b used in FIG. 6B, which may include a NVM cell, a buffer and a clamping transistor. The master and slave cells may be identical in a basic flip-flop application. The master cell may refer to the first stage (e.g., the first stage circuit 602) and the slave cell may refer to the second stage (e.g., the second stage circuit 604). Each of the master cell and the slave cell may have the configuration illustrated in FIG. 6D. Each stage module (or stage circuit) may have a NVM cell (e.g., 616a, 616b), a clamping transistor (e.g., 614a, 614b) and two transistors 643a, 643b from current mirror loads. The top part of the cell (or stage circuit) may include or consist of two current mirror loads 643a, 643b, which mirror half current ($I_{reft}$) from a high resistance branch and half current ($I_{refl}$) from a low resistance branch of a mid-point reference cell (see, e.g., FIG. 7) to obtain an average current of the two states. As mentioned above, each of the master and slave stage module (or stage circuit) may include a clamping transistor 614a, 614b. The gate voltage of the clamping transistor 614a, 614b may be controlled such that the clamping transistor 614a, 614b may be connected to $V_{dd}$ during write operation but to a clamp voltage, $V_{clamp}$ during read operation to prevent read disturbance and to generate the correct logic level for the output buffer 620a, 620b.

Figure 6E:
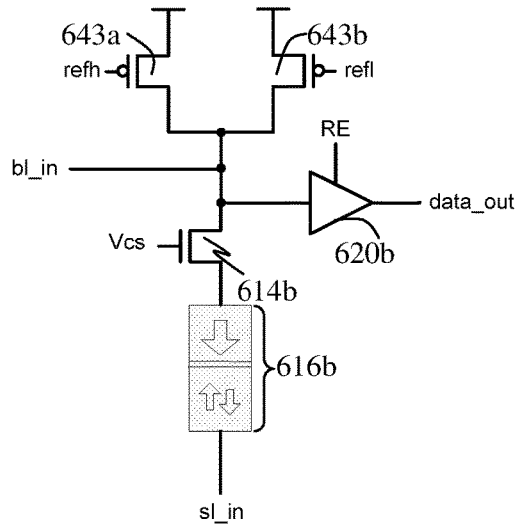
FIG. 6E shows a schematic diagram illustrating a realization of a slave cell of a resistive bipolar non-volatile flip-flop, in an application of a first-in-first out (FIFO) register file, in accordance with various embodiments.

FIG. 6E shows a schematic diagram illustrating a realization of the slave cell (e.g., 617b, FIG. 6C) in the bipolar non-volatile flip-flop of various embodiments, in an application of a first-in-first-out (FIFO) register file, i.e., when it is used in the application of the FIFO. The components and connections for the realization of FIG. 6E may be similar to that of FIG. 6D, with the following difference. For example, the buffer 620b may be controlled by the global RE signal of the FIFO operation. When RE is asserted, the data stored in the slave cell 617b (e.g., in the NVM cell 616b) may be output by the tri-state buffer 620b.

Figure 6F:
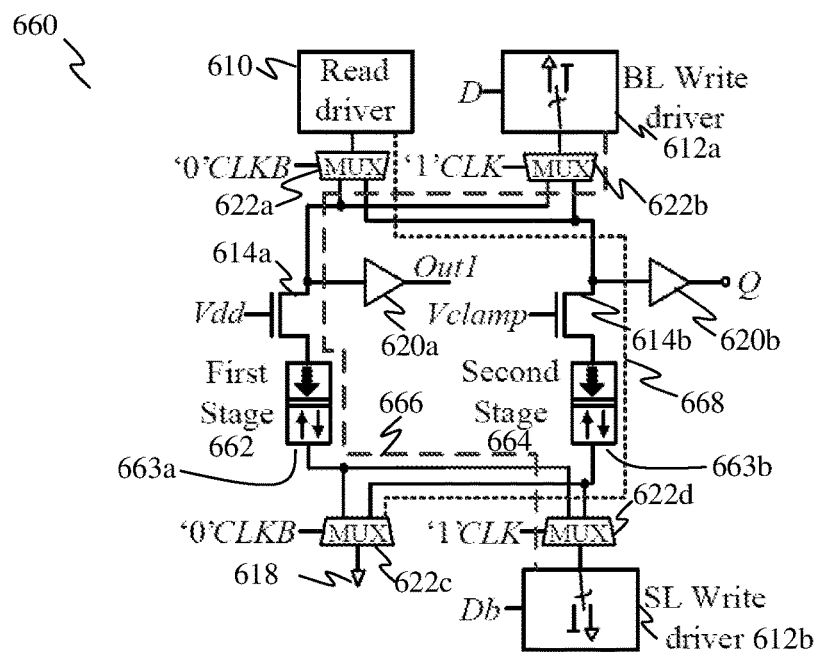
FIG. 6F shows a schematic diagram of a D-type flip-flop (DFF) circuit based on a spin-transfer torque magnetic random-access memory (STTMRAM) design when a clock signal CLK is high, in accordance with various embodiments.
Figure 6G:
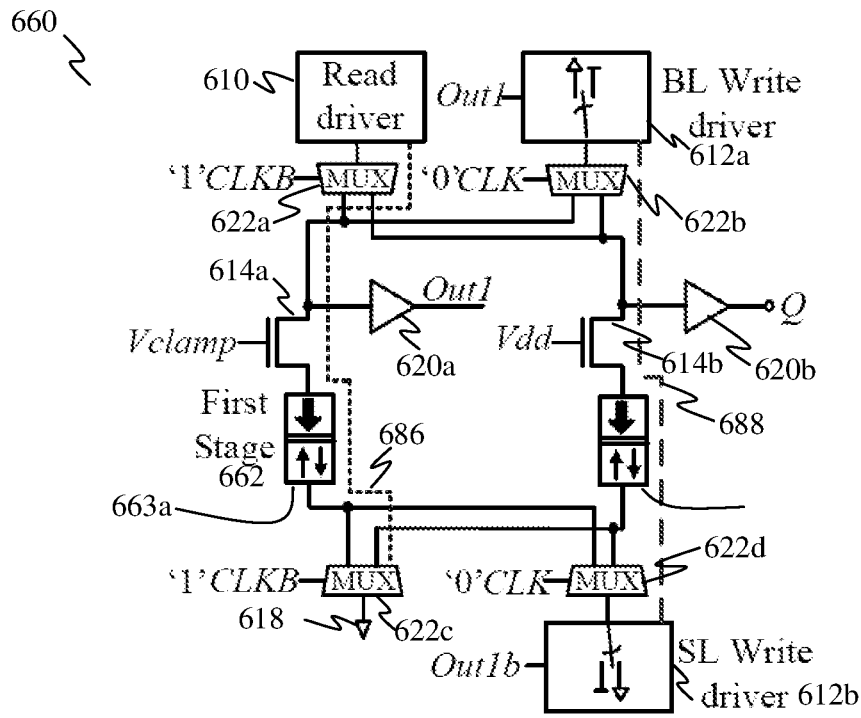
FIG. 6G shows a schematic diagram of the D-type flip-flop (DFF) circuit of FIG. 6C when a clock signal CLK is low, in accordance with various embodiments.

FIGS. 6F and 6G show schematic diagrams of a delay flip-flop or D-type flip-flop (DFF) 660 based on a dynamic pipeline configuration, in accordance with various embodiments. For example, the DFF 660 may be based on spin-transfer torque magnetic random-access memory (STT-MRAM) design. The DFF 660 may be described in similar context to the flip-flop circuit 600 of FIG. 6A. The parameters of the magnetic junction transistor (MJT) device (or STT-MRAM) are listed in Table 1.

TABLE 1

| Simulation parameters of a MTJ device. ||
|---|---|
| Parameters | Values |
| MTJ diameter (nm) | 65 |
| Parallel Resistance, $R_p$ (kΩ) | 2.2 |
| TMR (%) | 100 |
| $J_{C0}$ (A/cm$^2$)  $J_{C0}^{P \to AP}$ | 3.013 × 10$^6$ |
| $J_{C0}^{AP \to P}$ | 4.520 × 10$^6$ |

The DFF 660 (e.g., nvFF) may include or consist of two stages. Each stage (e.g., a first stage circuit 662 and a second stage circuit 664) may include or consist of a MTJ (NVM cell) 663a, 663b and a clamping transistor 614a, 614b. The gate voltage of the clamping transistor 614a, 614b may be biased with either (i) $V_{dd}$ during writing or (ii) $V_{clamp}$ (smaller than $V_{dd}$) during reading, respectively. This dual-voltage method and the careful sizing of the clamp transistor 614a, 614b may help to ensure correct write operation while avoiding MTJ breakdown during writing and may help to mitigate read disturbance and may generate a correct logic level for the output buffer during reading. To achieve saving in area, the first and second stage circuits 662, 664 may share the same set of bit line (BL) driver 612a and source line (SL) driver 612b. This may be realized by pipelining the first and second stage circuits 662, 664 during two clock phases (when a clock signal, CLK='1' or '0'), since only one stage circuit may be required to operate in a write mode or a read mode.

Examples of the operations of the nvFF may be as follows: for the DFF 660 in FIG. 6F, when CLK level is '1', the first stage circuit 662 operates in write mode (or write operation) while the second stage circuit 664 operates in read mode (or read operation). More specifically, when CLK level is '1', a logic '1' may be input to multiplexers (MUXs) 622b, 622d, and a logic '0' (e.g., a signal, CLKB, being complementary to CLK, is '0') may be input to multiplexers (MUXs) 622a, 622c. A dashed line 666 reflects a write path, while a dotted line 668 reflects a read path. The first stage circuit 662 may sample a data input (or information), D (input through the BL write driver 612a) and write to the MTJ 663a in the first stage circuit 662, with the clamping transistor 614a biased at $V_{dd}$ and the clamping transistor 614b biased at $V_{clamp}$. Db, a signal complementary to D, may be input to the SL write driver 612b. The input data value may determine the write current direction. Meanwhile, the second stage circuit 664 may hold and output the logic level from the previous clock phase. The information or logic level outputted from the second stage circuit 664 may be provided to the buffer 620b coupled to a drain terminal of the clamping transistor 614b, and further provided as the output of the previous clock, $Q_{t-1}$, where t represents time.

In contrast, when CLK level is '0', the first stage circuit 662 is in read mode while the second stage circuit 664 is in write mode, as depicted for the DFF 660 in FIG. 6G. More specifically, when CLK level is '0', a logic '0' may be input to the multiplexers (MUXs) 622b, 622d, and a logic '1' (e.g., CLKB, being complementary to CLK, is '1') may be input to the multiplexers (MUXs) 622a, 622c. In this case, the clamping transistor 614a may be biased at $V_{clamp}$ and the clamping transistor 614b may be biased at $V_{dd}$. A dashed line 688 reflects a write path, while a dotted line 686 reflects a read path. The second stage circuit 664 may sample the output of the first stage circuit 662 (which holds its value from the previous clock phase, e.g., the Out1 signal from the buffer 620a may be provided to the BL write driver 612a and its complementary Out1b signal may be provided to the SL write driver 612b), then write to memory cell 663b, and generate the output for the current clock, $Q_t$, where t represents time. The four multiplexers (MUXs) 622a, 622b, 622c, 622d may control the current-flow from the drivers 610, 612a, 612b to the first and second stage circuits 662, 664 at respective clock phases. In various embodiments, the read driver 610 may be a current mirror load. A tri-state buffer, with a control input WE (write enable, not shown in FIGS. 6F and 6G), may serve as the write driver 612a, 612b.

Figure 7:
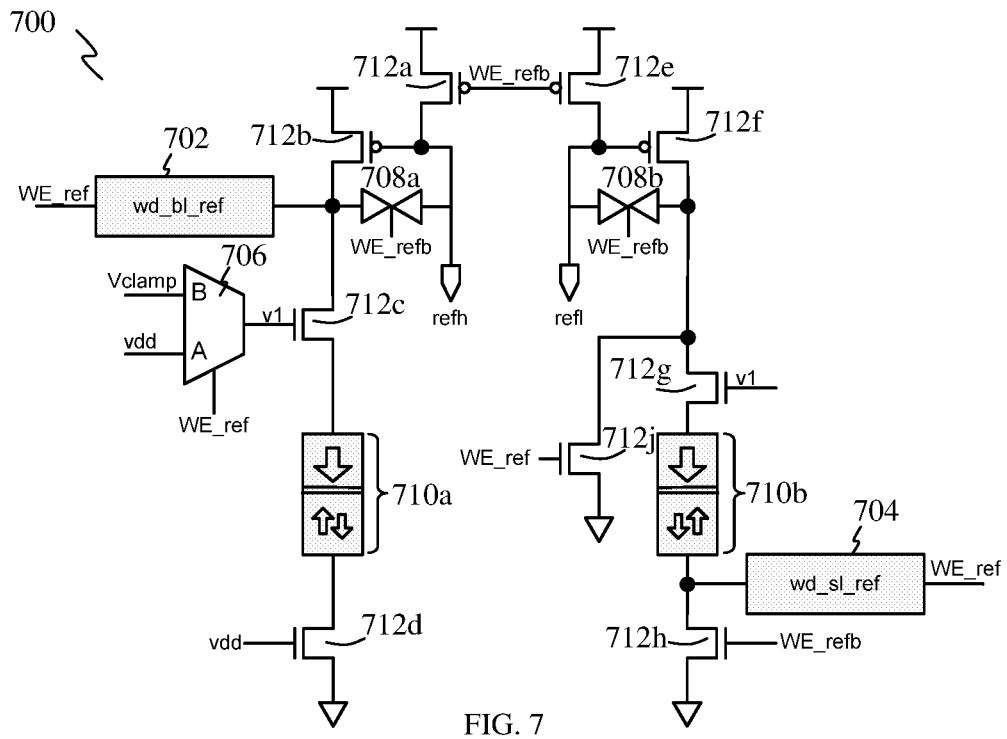
FIG. 7 shows a schematic diagram of a mid-point reference circuit, in accordance with various embodiments.

FIG. 7 shows a schematic diagram of a mid-point reference circuit 700, in accordance with various embodiments. For example, the mid-point reference circuit 700 (or the mid-point reference generator circuit) may be used to generate reference currents (e.g., a high reference current, refh, and a low reference current, refl) for implementation in the realization illustrated in FIG. 6B. The mid-point reference circuit 700 may be shared among multiple flip-flops, e.g., for flip-flops in a byte or a word, to achieve area saving.

The mid-point reference circuit 700 may include or consist of two STT-MRAM cells 710a, 710b which may be pre-programmed such that one has high resistance and the other has low resistance. By adopting MTJ as reference cells 710a, 710b, the mid-point reference circuit 700 may be able to track process variation and on-chip-temperature variation. During read operation, two currents may be generated from the high resistance and the low resistance branches, which may be mirrored by a factor of about 0.5 towards the NVM cells in the first and second stage circuits of the flip-flop. By halving and summing the high and low currents, an average reference current may be obtained. The comparison of the flip-flop current and the reference current may then determine the logic level during reading for each stage. The programming of the reference circuit 700 may be carried out during the startup of the memory chip or a dedicated calibration cycle when the chip is in idle mode or standby mode, and may be controlled by a WE_ref signal. When WE_ref is '1' (logic "HIGH"), four p-channel or p-type metal-oxide-semiconductor (PMOS) transistors 712a, 712b, 712e, 712f and the two transmission gate switches 708a, 708b may be disconnected from the circuit 700. The gate voltage v1 of two clamping transistors 712c, 712g may equal to $V_{dd}$. One NVM cell 710a may be written to high resistance by a write driver 702 through a current path including or consisting of the write driver 702, the clamping transistor 712c, the NVM cell 710a and the n-channel or n-type metal-oxide-semiconductor (NMOS) transistor 712d. The other NVM cell 710b on the opposite branch may be written to low resistance by a write driver 704 through a current path including or consisting of the write driver 704, the NVM cell 710b, the clamping transistor 712g, and the NMOS transistor 712j. The NMOS transistor 712j may be coupled to the drain of the clamping transistor 712g. The NMOS transistor 712j may be controlled by WE_ref. When WE_ref is '0' (logic "LOW"), the transistors 712a, 712b, 712e, 712f, and the transmission gate switches 708a, 708b may turn into diode-connected configuration(s) and mirror the two reference currents into the two stage circuits of the flip-flop.

Figure 8:
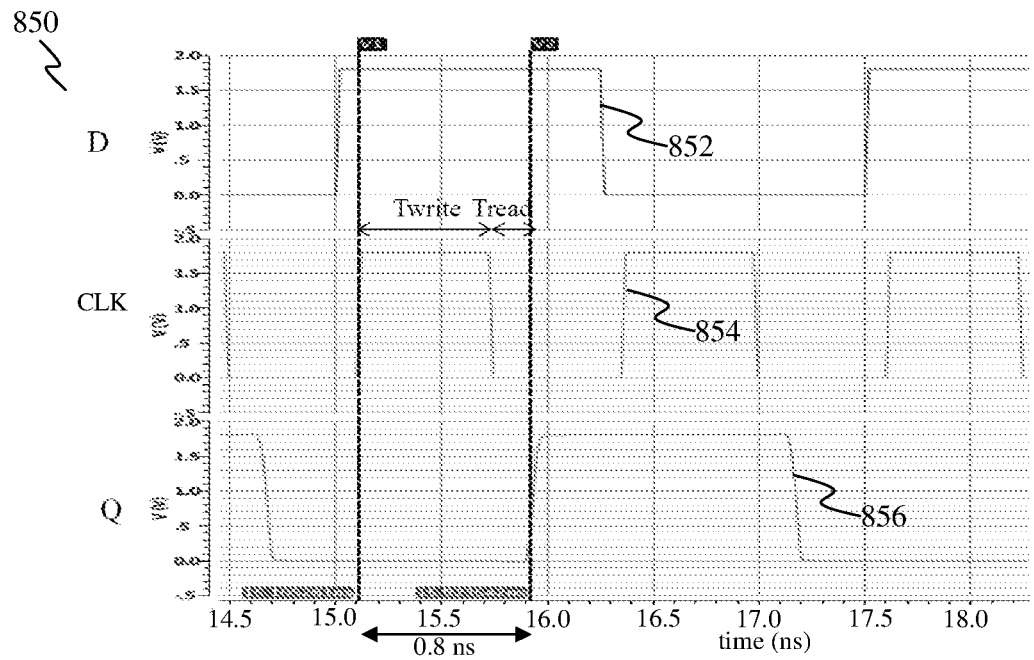
FIG. 8 shows a plot illustrating a voltage vs time relationship between an input D and an output Q for a non-volatile D-type flip-flop (nvDFF) (low to high transition), in accordance with various embodiments.

Based on the realization or implementation as shown in FIG. 6B, a simulation of a dynamic non-volatile flip-flop (e.g., based on spin-transfer torque magnetic random-access memory (STT-MRAM)) may be carried out. FIG. 8 shows a plot 850 illustrating a voltage vs time relationship between an input D and an output Q for a nvDFF (e.g., the flip-flop circuit 600 of FIG. 6A, e.g., based on STT-MRAM), for low to high transition, in accordance with various embodiments. In FIG. 8, result 852 represents an input signal D, result 854 represents a clock (clk) signal of 800 MHz, and result 856 represents an output signal Q. At the rising clock edge, the first stage circuit of the nvDFF starts the operation of writing in data. At the falling clock edge, the second stage circuit of the nvDFF starts the operation of reading out data. More specifically, at the falling clock edge, the second stage circuit may be in write operation when data stored in the NVM cell of the first stage circuit may be written into the NVM cell of the second stage circuit, and at the same time, the second stage circuit may output the data. In other words, the second stage circuit may output the output signal Q at the falling clock edge. It may be observed from FIG. 8 that the write time ($T_{write}$) is about 0.625 ns and the read time ($T_{read}$) is about 0.175 ns. The total time for the write operation and the read operation (low to high transition) is about 0.8 ns.

Figure 9:
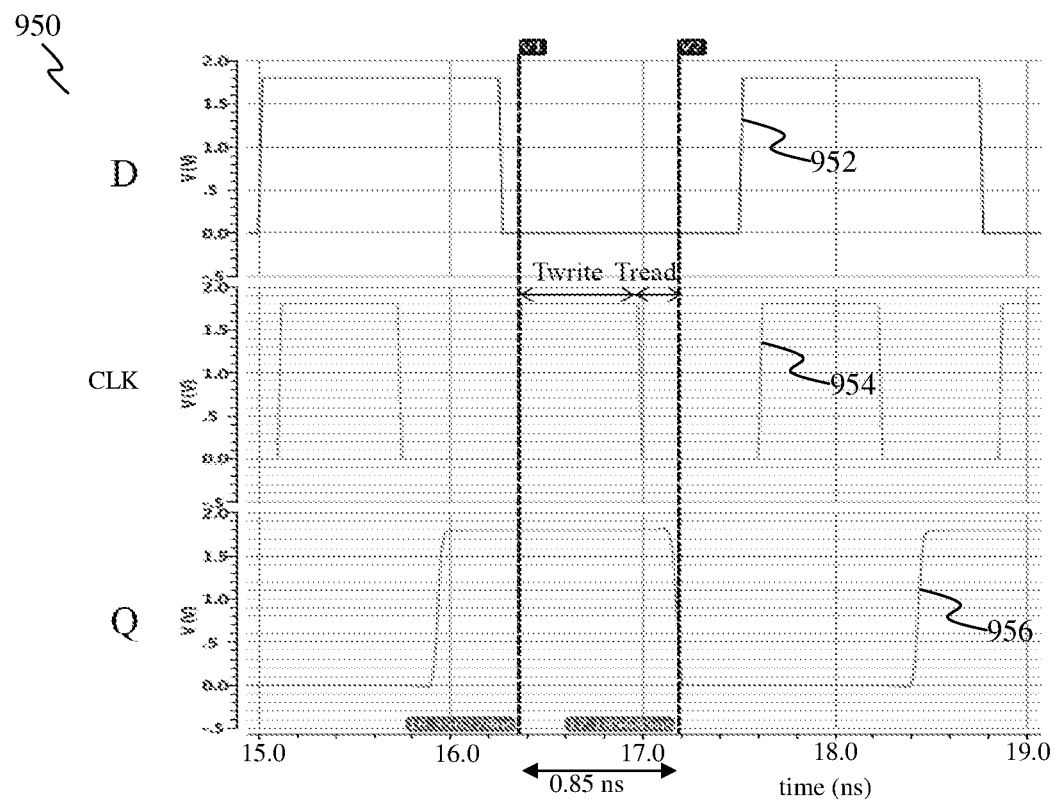
FIG. 9 shows a plot illustrating a voltage vs time relationship between an input D and an output Q for a non-volatile D-type flip-flop (nvDFF) (high to low transition), in accordance with various embodiments.

FIG. 9 shows a plot 950 illustrating a voltage vs time relationship between the input D and the output Q for a nvDFF (e.g., the flip-flop circuit 600 of FIG. 6A, e.g., based on STT-MRAM), for high to low transition, in accordance with various embodiments. In FIG. 9, result 952 represents the input signal D, result 954 represents the clock (clk) signal of 800 MHz, and result 956 represents the output signal Q. It may be observed from FIG. 9 that the write time ($T_{write}$) is about 0.65 ns and the read time ($T_{read}$) is about 0.20 ns. The total time for the write operation and the read operation (high to low transition) is about 0.85 ns.

Figure 10:
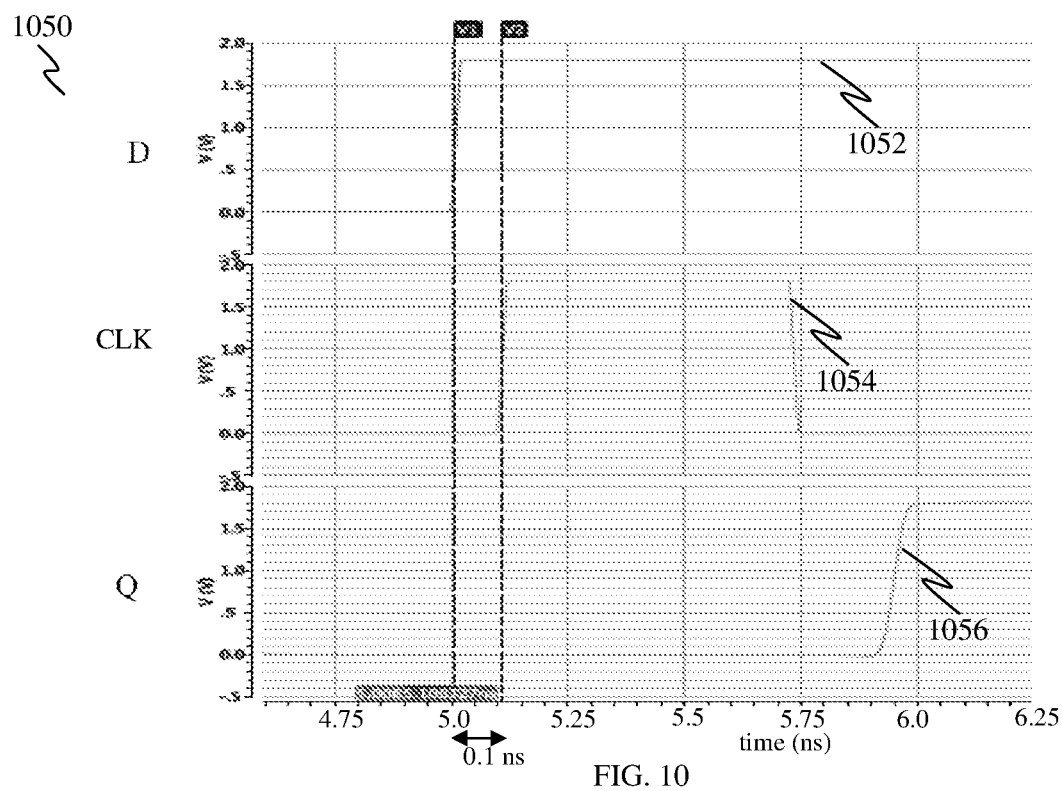
FIG. 10 shows a plot illustrating a voltage vs time relationship between the input D and the output Q for a non-volatile D-type flip-flop (nvDFF) (observed for a setup time), in accordance with various embodiments.

FIG. 10 shows a plot 1050 illustrating a voltage vs time relationship between the input D and the output Q for a nvDFF (e.g., the flip-flop circuit 600 of FIG. 6A, e.g., based on STT-MRAM), with a transient response observed for a setup time, in accordance with various embodiments. In FIG. 10, result 1052 represents the input signal D, result 1054 represents the clock (clk) signal of 800 MHz, and result 1056 represents the output signal Q. Markers V1 and V2 are placed at about 50% rising edge of the input signal D 1052 and the clock signal CLK 1054, respectively, to determine the set-up time of the design in accordance with various embodiments. The set-up time ($T_{setup}$) of about 0.1 ns may be attained.

Figure 11:
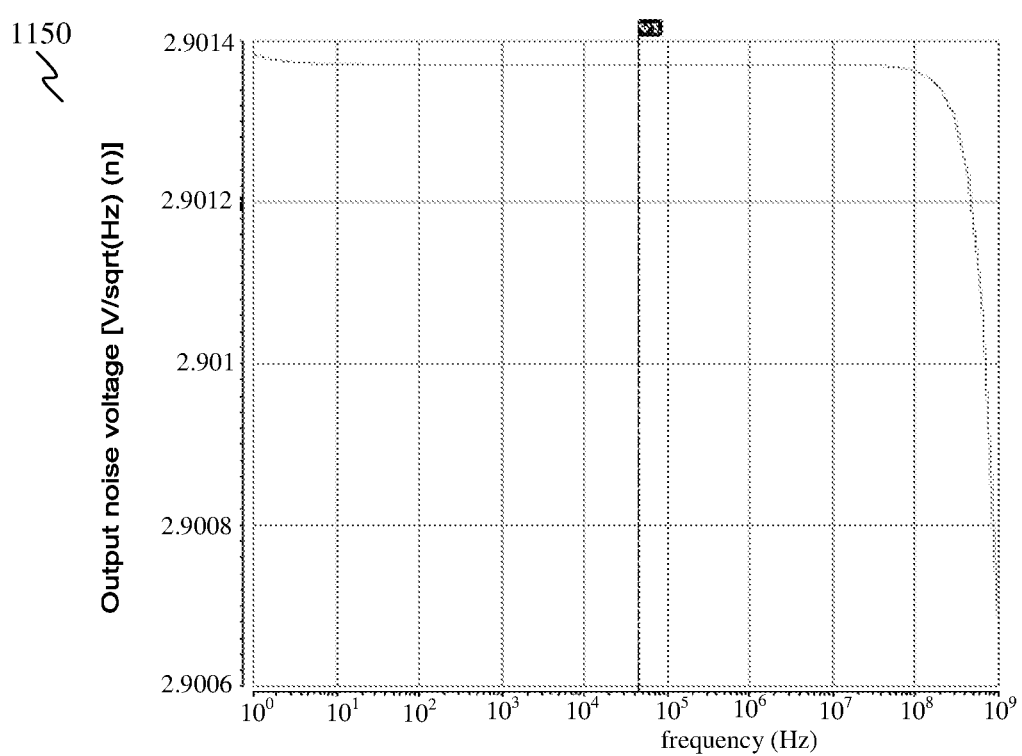
FIG. 11 shows a plot for noise analysis illustrating an output noise voltage vs frequency relationship, in accordance with various embodiments.

Thermal noise may be introduced for the STT-MRAM) and included in a compact model. Thermal noise may be considered as white noise. Simulation result shows that a clamping transistor may mitigate the noise effect by preventing or at least minimizing direct coupling of the STT-MRAM noise to an input of a sense amplifier. The noise rejection may be about 50%. FIG. 11 shows a plot 1150 for noise analysis illustrating an output noise voltage vs frequency relationship, in accordance with various embodiments. Based on an input noise voltage of about 5.75 nV, an output noise voltage of about 2.9 nV (noise response at V1 being about 2.90117 nV) at about $4.5 \times 10^4$ Hz may be observed, leading to about 50% reduction of thermal noise.

Differences between the nvFF (or nvDFF) in accordance with various embodiments and existing memory structures may be in that, for example, the nvFF in accordance with various embodiments may be of a single-ended, dynamic architecture instead of a conventional static differential latch based non-volatile flip-flop. Further, "reload" and "save" operations may not be required in the nvFF (or nvDFF) in accordance with various embodiments. The nvFF (or nvDFF) in accordance with various embodiments may provide sharing of a write driver and a read driver, and may have smaller parasitic capacitance, which may lead to high speed operation. The nvFF (or nvDFF) in accordance with various embodiments may also have a clamping transistor to prevent or at least minimize read disturbance.

The nvFF (or nvDFF) in accordance with various embodiments may have advantages over existing memory structures. For example, the nvFF (or nvDFF) in accordance with various embodiments may have faster operating speed than a conventional static latch based non-volatile flip-flop, lower standby power consumption, faster wake-up time as "reload" and "save" operations are not required, smaller area due to sharing of write and read drivers, higher speed due to smaller parasitic capacitance, capability to avoid unnecessary read-write disturbance, and improved reliability of a non-volatile flip-flop.

The nvFF (or nvDFF) in accordance with various embodiments may be used in the ALU (arithmetic logic unit) flip-flops, register file and L1 cache to save power during operating/idle modes. With reference to FIG. 1 at 108, the nvFF (or nvDFF) in accordance with various embodiments may have an access time of about 0.95 ns delay.

Figure 12A:
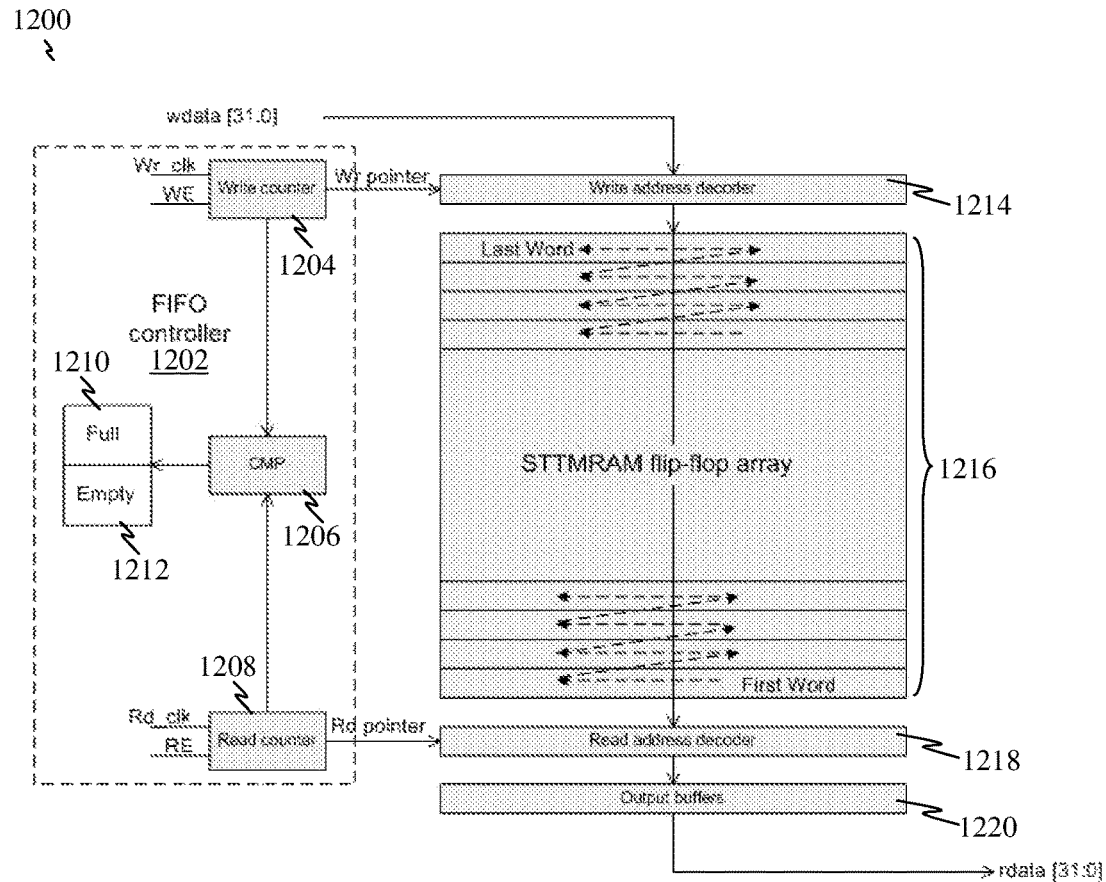
FIG. 12A shows a schematic diagram illustrating an architecture of a first-in-first-out (FIFO) register file based on the flip-flop circuit of various embodiments.

FIG. 12A shows a schematic diagram illustrating an architecture 1200 of a first-in-first-out (FIFO) register file based on the flip-flop circuit (e.g., dynamic two-stage-pipeline-based non-volatile flip-flop (nvFF)) of various embodiments (e.g., based on the embodiments shown in FIGS. 6C and 6D). For example, the architecture 1200 may refer to an application of the dynamic resistive non-volatile flip-flop in a high-speed first-in-first-out (FIFO) register file. The FIFO architecture 1200 (or may also be referred to as a first-in-first-out memory) may include or consist of a FIFO controller (e.g., a digital controller) 1202 and a non-volatile flip-flop array (e.g., a STT-MRAM flip-flop array) 1216 having a plurality of flip-flop circuits as described herein. For example, the non-volatile flip-flop array 1216 may be a 128×32 bit register array (STT-MRAM D flip-flops), which may contain Word 0 (32 bits) (First Word) to Word 127 (Last Word). In other words, the non-volatile flip-flop array 1216 may have a basic building block of a 4 Kbits nvFIFO register file. For example, the architecture 1200 may be an architecture of a 4 Kbits nvFIFO array with a digital controller 1202. Read and write pointers (Wr pointer and Rd pointer) generated by the controller 1202 may be used to control the address of the flip-flops. The Wr pointer from a write counter 1204 may be coupled to a write address decoder 1214 which may be coupled to the flip-flop array 1216. The write counter 1204 may receive a control input or write enable signal (WE), and a clock signal (CLK) or a write clock signal (Wr clk). The Rd pointer from a read counter 1208 may be coupled to a read address decoder 1218 which may be coupled to the flip-flop array 1216 and output buffers 1220. The read counter 1208 may receive a control input or read enable signal (RE), and a clock signal (CLK) or a read clock signal (Rd clk). The write address decoder 1214 may receive, for example, a 32-bit data, wdata [31:0] and the output buffers 1220 may output, for example, a 32-bit output data, rdata [31:0]. In the controller 1202, a comparator (CMP) unit 1206 may provide an "Empty" flag 1212 and a "Full" flag 1210, denoting whether the FIFO 1200 has no data or it is fully occupied, respectively. The FIFO register file (the FIFO architecture 1200) may be used as a buffer between a high speed interface (e.g., USB 3.0) and the storage media (e.g., hard disk, solid-state drive) to reduce wake-up time and power consumption.

As an example, the nvFIFO array 1216 may be arranged into 64 rows by 64 columns, with 32 bits word length. The nvFIFO controller 1202 may run at a clock frequency of 100 MHz. The digital controller 1202 may generate the write and read addresses for the write and read decoders 1214, 1218, respectively, which may then select the word to be accessed. Write and read counters 1204, 1208 may be used to generate the write and read addresses when WE='1' and RE='1', respectively. An "Empty" flag 1212 may be raised when all data are read, i.e., when the read address equals to the write address. Also, a "Full" flag 1210 may be activated when all FIFO slots are being occupied, i.e., when the write address reaches the highest address. The address comparison may be performed by the comparator 1206. Data may be written incrementally starting from the lowest address word, and to the highest address at the top left corner of the array 1216 in a raster manner. The wdata and rdata may be combined to form a 32-bit DQ data bus through bi-directional input-output (IO) pads. The FIFO 1200, in accordance with various embodiments, may be designed with 0.18 μm CMOS process. The MTJs may be designed for integration in back-end-of-line process.

Figure 12B:
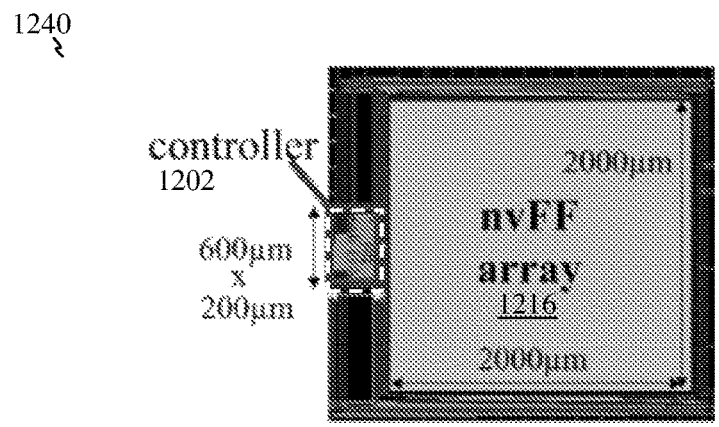
FIG. 12B shows a diagram illustrating a corresponding layout of the array of FIG. 12A.

FIG. 12B shows a diagram illustrating a corresponding layout 1240 of the array of FIG. 12A. The nvFF array 1216 may have a dimension of about 2000 μm×2000 μm, and the controller (or digital controller) 1202 (within the white dashed box) may have a dimension of about 600 μm×200 μm.

Figure 13A:
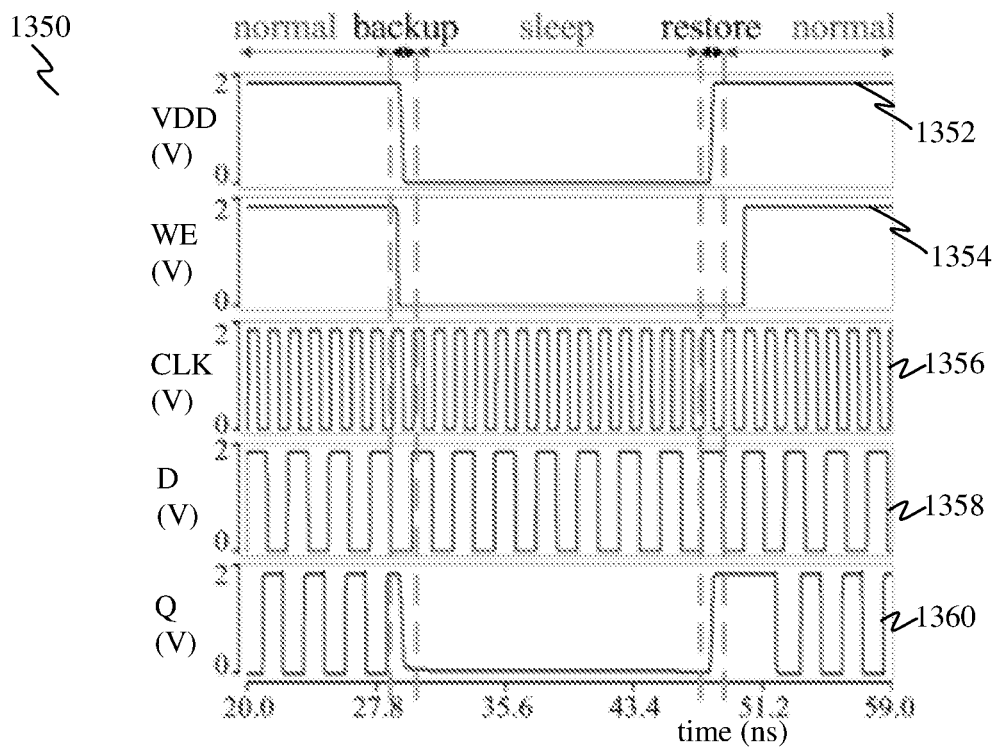
FIG. 13A shows a plot illustrating timing diagrams of various signals depicting normal, backup, sleep and restore modes of a non-volatile flip-flop (nvFF), in accordance with various embodiments.

Simulations were performed using a Cadence Spectre simulator (Cadence Design Systems, Inc., USA) with the MTJ model developed in Verilog-A language. Although the nvFF in accordance with various embodiments has been designed and simulated with a nominal CLK speed of about 100 MHz, simulation has shown that the nvFF in accordance with various embodiments may operate even at about 800 MHz. FIG. 13A shows a plot 1350 illustrating timing diagrams of corresponding normal, backup, sleep and restore modes of the nvFF, in accordance with various embodiments. More specifically in FIG. 13A, simulation waveforms of the nvFF, in accordance with various embodiments, under a sequence of normal, backup, sleep, and restore operations, at a clock frequency of about 800 MHz depict result 1352 representing a power source, Vdd, result 1354 representing a write enable (WE) signal, result 1356 representing a clock (clk) signal, result 1358 representing an input signal, D, and result 1360 representing an output signal, Q. When Vdd is powered down while entering sleep mode, data '1' may be stored in the MTJ.

Table 2 shows a comparison of performance of the non-volatile flip-flop (e.g., the dynamic DFF or nvDFF), in accordance with various embodiments, a prior art perpendicular-anisotrophy CoFeB/MgO magnetic tunnel junction (PMA_MTJ), a prior art ultra low power magnetic flip-flop (ULP_MFF), and a prior art MJT-based non-volatile flip-flop (MJT_nvFF) during backup and restore operations.

TABLE 2

Comparison of STT-MRAM flip-flops during backup and restore operations.

| Term | nvFF or DFF | PMA_MJT | ULP_MFF | MJT_nvFF |
|---|---|---|---|---|
| Technology node | 180 nm | 65 nm | 40 nm | 45 nm |
| STT-MJT | | Perpendicular | | In-plane |
| MJT size | 65 nm | 65 nm | 40 nm | 40 nm × 100 nm |
| Backup time | 198 ps | 1.6 ns | 4 ns | — |

TABLE 2-continued

Comparison of STT-MRAM flip-flops during backup and restore operations.

| Term | nvFF or DFF | PMA_MJT | ULP_MFF | MJT_nvFF |
|---|---|---|---|---|
| Backup energy | 18.6 fJ | 1 pJ | 25~510 fJ | — |
| Restore time | 91 Ps | 100 Ps | 400 Ps | 184.2 Ps |
| Restore energy | 8.3 fJ | — | 12 fJ | 8.13 fJ |

The dynamic pipeline DFF in accordance with various embodiments may achieve a backup time of about 198 ps, which is about 7× and about 19× faster than the PMA_MJT and the ULP_MFF, respectively. Moreover, the design in accordance with various embodiments may achieve the shortest restore time of about 91 ps, which is about 9.9%, about 3.4× and about 1× better than the PMA_MJT, the ULP_MFF, and the MJT-nvFF, respectively. The backup and restore times may be considerably small because the latch time of conventional sense-amplifier-based non-volatile flip-flop has been avoided. The design in accordance with various embodiments may achieve about 52× and about 34.4% backup energy improvement over the PMA_MJT and the ULP_MFF, respectively. The design in accordance with various embodiments may also achieve about 44.6% restore energy improvement over the ULP_MFF and only about 2% more than the MJT_nvFF, even though the design was simulated with a more matured 180 nm technology node with higher Vdd value.

As observed from Table 2, the dynamic pipeline architecture in accordance with various embodiments may be adopted to achieve fast backup time of about 198 ps and low energy of about 18.6 pJ, The restore time and energy may be about 91 ps and 8.3 pJ, respectively. Without inherent latch time of cross-coupled inverters (as mentioned above), the dynamic pipeline architecture in accordance with various embodiments may achieve at least 7× on backup time and about 9.9% on restore time improvement over existing designs.

Figure 13B:
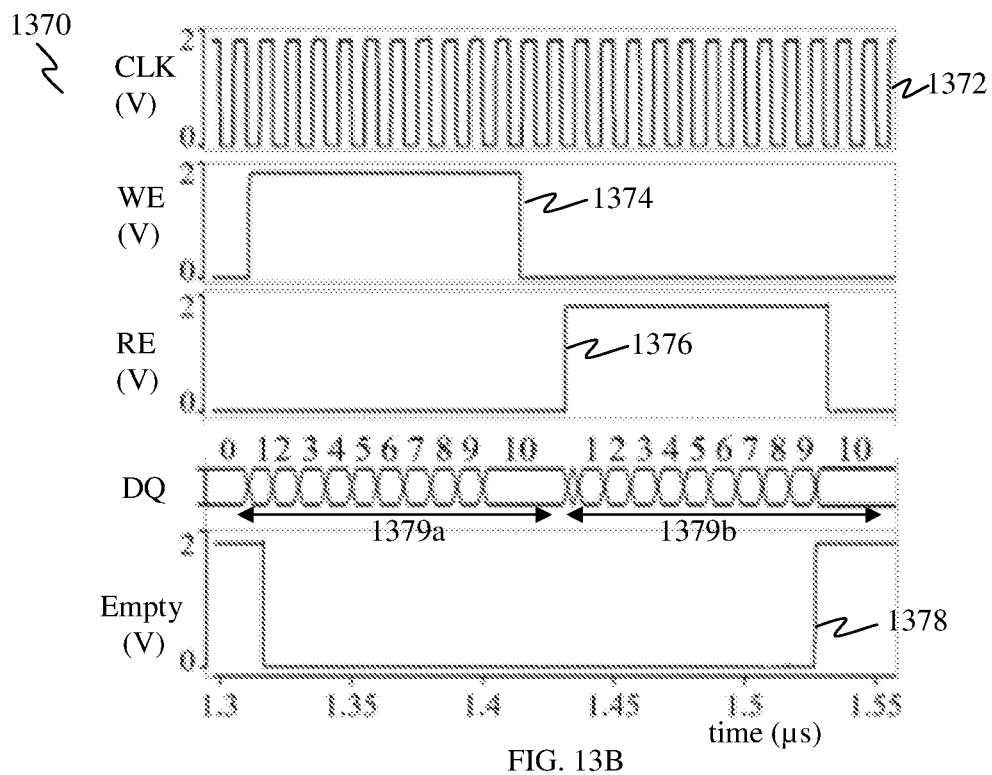
FIG. 13B shows a plot illustrating simulation results (timing diagrams) of various signals of a non-volatile first-in-first-out (nvFIFO) architecture, in accordance with various embodiments.

FIG. 13B shows a plot 1370 illustrating the simulation results of the nvFIFO in accordance with various embodiments, operating at about 100 MHz, with 4 bytes transferred each cycle. This design may achieve a transfer rate of 400 MB/s. More specifically in FIG. 13B, simulation waveforms of a 4 Kbit nvFIFO array operating at about 100 MHz clock depict result 1372 representing a clock (clk) signal of 100 MHz, result 1374 representing a write enable (WE) signal, result 1376 representing a read enable (RE) signal, result 1378 representing an "Empty" flag, result 1379a representing data written to the FIFO and result 1379b representing data read from the FIFO. Results 1379a, 1379b may be referred to as a DQ signal.

In the test-bench, a sequence of binary data from 1 to 10 (shown in decimal) is being pushed into the FIFO through the bidirectional data bus, DQ [31:0] (result 1379a) when WE (result 1374) is '1'. When RE (result 1376) is '1', data may be loaded from the nvFIFO to the data bus, DQ [31:0] (result 1379b) following a first-in-first-out order. The "Empty" flag (result 1378) is '1' when all data may be read out (after DQ=10). These results reflect the systematic operations of the nvFIFO in accordance with various embodiments.

Figure 13C:
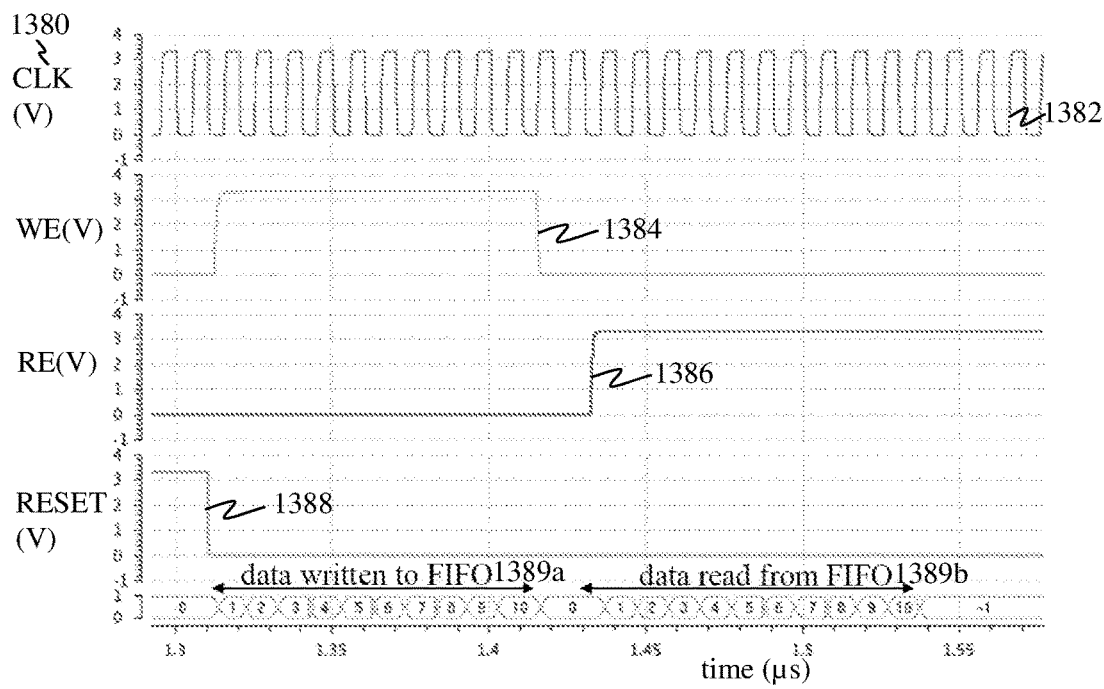
FIG. 13C shows a plot illustrating timing diagrams of various signals of a first-in-first-out (FIFO) architecture, in accordance with various embodiments.

In another example, FIG. 13C shows a plot 1380 illustrating timing diagrams of a FIFO architecture, in accordance with various embodiments. The timing diagrams may be obtained from FIFO simulation results in terms of voltage vs time relationships. In FIG. 13C, result 1382 represents a clock (clk) signal of 200 MHz, result 1384 represents a write enable signal, result 1386 represents a read enable signal, result 1388 represents a reset signal, result 1389a represents data written to the FIFO and result 1389b represents data read from the FIFO. Results 1389a, 1389b may be referred to as a DQ signal. The systematic operations observed from the simulation results in FIG. 13B may also be similarly applicable to those of FIG. 13C.

Figure 13D:
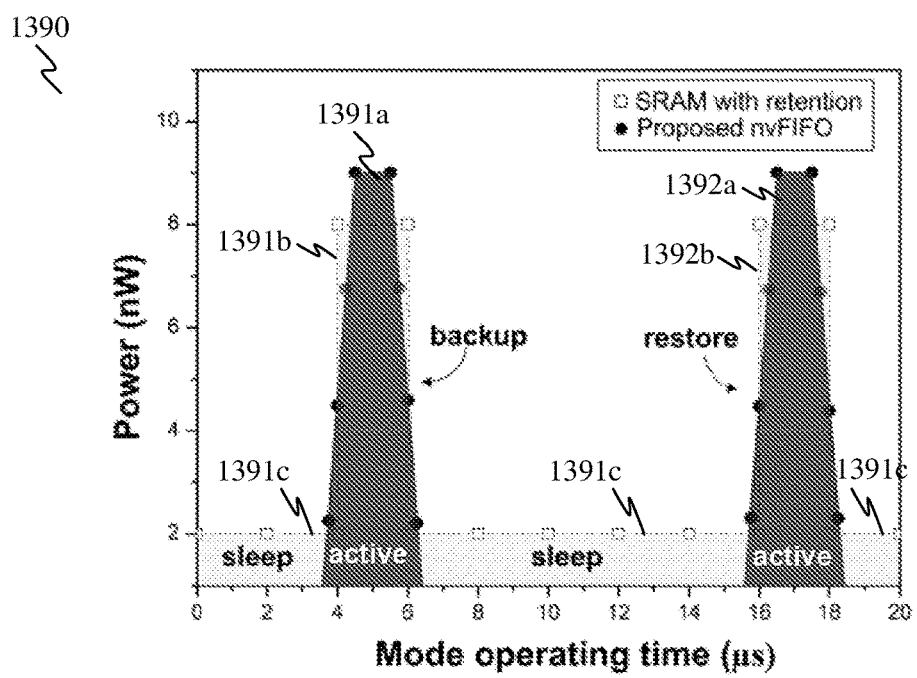
FIG. 13D shows a power-vs-mode operating time plot illustrating a comparison of anon-volatile first-in-first-out (nvFIFO) architecture in accordance with various embodiments against a conventional design with a static random-access memory (SRAM), accessed for energy efficiency.

A comparison of the nvFIFO in accordance with various embodiments against a conventional design with a static random-access memory (SRAM) has been accessed for energy efficiency, as shown in a power-vs-mode operating time plot 1390 of FIG. 13D. In FIG. 13D, power consumption of the nvFIFO in accordance with various embodiments and the static random-access memory first-in-first-out (SRAM FIFO) during active, backup, sleep and restore modes (or operations) may be observed, assuming about 80% time in the sleep mode. Result 1391a represents the nvFIFO being active in the backup mode, result 1391b represents the SRAM with retention being active in the backup mode, while result 1392a represents the nvFIFO being active in the restore mode, and result 1392b represents the SRAM with retention being active in the restore mode. Result 1391c represents the SRAM with retention in the sleep mode. As mentioned above, here, the simulation assumed that the system is in sleep mode (or sleep operation), 80% of a period. During the sleep mode, the nvFIFO in accordance with various embodiments consumes no leakage power as the power gate is switched off. In the active mode (or active operation), the dynamic power of the nvFIFO is about 12% higher than the SRAM FIFO due to the write current requirement of the MTJ under consideration. From the area under the curve, the calculated total energy consumption of the nvFIFO (results 1391a, 1392a) is reduced by about 43.75% compared to the SRAM FIFO (results 1391b, 1392b, 1391c) over the same period. This represents that the nvFIFO in accordance with various embodiments has no leakage or at least insignificant amount of leakage during the sleep mode.

Moreover, the data transfer rate of the nvFIFO with microprocessor (µP) system has been evaluated with a 64-bit version of the x86 instruction set (x86_64) architecture platform, as a buffer for network interface of Transmission Control Protocol/Internet Protocol (TCP/IP), using a micro architectural system simulator of x86 based systems (MARSSx86). FIGS. 13E and 13F show comparisons of the systems adopting the nvFIFO, in accordance with various embodiments, and the conventional SRAM FIFO using an open-source benchmark suite, PARSEC (Princeton University, USA). The specific workloads used are streamcluster and ferret, which are related to online streaming and server search, respectively. More specifically, FIG. 13E shows a plot 1393 illustrating a comparison of instruction per cycle (IPC) of the µP system including or consisting of the nvFIFO in accordance with various embodiments and the SRAM FIFO. In other words, FIG. 13E depicts the relationships between normalized IPC under specific workloads of streamcluster and ferret for the nvFIFO in accordance with various embodiments and the SRAM FIFO. Result 1394a represents normalized IPC of the streamcluster workload at thread 0 for the nvFF, result 1394b represents normalized IPC of the streamcluster workload at thread 0 for the SRAM, result 1394c represents normalized IPC of the streamcluster workload at thread 1 for the nvFF, result 1394d represents normalized IPC of the streamcluster workload at thread 1 for the SRAM, while result 1395a represents normalized IPC of the ferret workload at thread 0 for the nvFF, result 1395b represents normalized IPC of the ferret workload at thread 0 for the SRAM, result 1395c represents normalized IPC of the ferret workload at thread 1 for the nvFF, result 1395d represents normalized IPC of the ferret workload at thread 1 for the SRAM. The simulation test-bench takes into consideration of a dual core processor system. Threads 0 and 1 represent 2 basic unit sequences of computation instructions. From FIG. 13E, the instruction per cycle (IPC) of the μP with the nvFIFO show about 50% improvement for streamcluster and about 30% for ferret workloads. The improvement may be higher for the streamcluster as there may often be more read operations and fewer write operations as compared to the ferret workload.

The power consumption may be divided into dynamic power and leakage power. More specifically, FIG. 13F shows a plot 1396 illustrating a comparison of dynamic and leakage power of the μP system including or consisting of the nvFIFO in accordance with various embodiments and the SRAM FIFO. In other words, FIG. 13F depicts the relationships between normalized power and workloads of streamcluster and ferret for the nvFIFO in accordance with various embodiments and the SRAM FIFO. Result 1397a represents normalized dynamic power for the nvFF with the streamcluster workload, result 1397b represents normalized dynamic power for the SRAM with the streamcluster workload, result 1397c represents normalized dynamic power for the nvFF with the ferret workload, result 1397d represents normalized dynamic power for the SRAM with the ferret workload, while result 1398a represents normalized leakage power for the nvFF with the streamcluster workload, result 1398b represents normalized leakage power for the SRAM with the streamcluster workload, result 1398c represents normalized leakage power for the nvFF with the ferret workload, result 1398d represents normalized leakage power for the SRAM with the ferret workload. In FIG. 13F, although the system with nvFIFO has about 10% higher dynamic power consumption, its leakage power is about 10× smaller as compared to the conventional SRAM design. Therefore, critical leakage power saving maybe achieved when sleep mode dominates.

Both nvFF and nvFIFO based on STT-MRAM have been designed and verified via simulation. Due to the dynamic pipeline architecture in accordance with various embodiments, the nvFF in accordance with various embodiments may achieve ultra-fast backup and restore time with very low energy consumption even though simulated with a more matured technology node. The 4 Kbits nvFIFO register file designed (or the 4 Kbits FIFO array) based on the nvFF in accordance with various embodiments (e.g., the STT-MRAM flip-flop designed for the network interface of the μP system) may demonstrate a reduction in energy by about 43.75% and may achieve about 30% improvement in IPC as compared to the conventional SRAM. With a leakage power which is about 10× smaller as compared to that of the SRAM design (as shown in the simulation), the nvFIFO in accordance with various embodiments may provide a potential avenue for achieving lower energy consumption in a normally-off μP design.

FIG. 14 shows a schematic diagram illustrating an architecture 1400 of a cache system for processor based on the flip-flop circuit (e.g., dynamic two-stage-pipeline-based non-volatile flip-flop) of various embodiments. In other words, the architecture 1400 may be a non-volatile cache architecture and may, for example, be referred to as an application of the dynamic resistive non-volatile flip-flop in a high-speed cache system. The architecture 1400 (or the non-volatile flip-flop based cache) may include or comprise a non-volatile flip-flop array (e.g., a STT-MRAM cache) 1404 and a cache controller 1402 (e.g., with least-recently use (LRU) algorithm to increase the access speed between a central processing unit (CPU) and a main memory (not shown in FIG. 14)). The cache controller 1402 may generate a cache 'hit' (miss=0) or 'miss' (miss=1) by determining the requested address by the CPU 1406 that has been written previously, and by loading the data from the flip-flop array 1404 in the case of cache 'hit'. If 'miss' (miss=1), the data may be loaded from themain memory. In other words, if miss=1, the cache controller 1402 may generate access to the main memory or a next level cache (not shown in FIG. 14).

Figure 15:
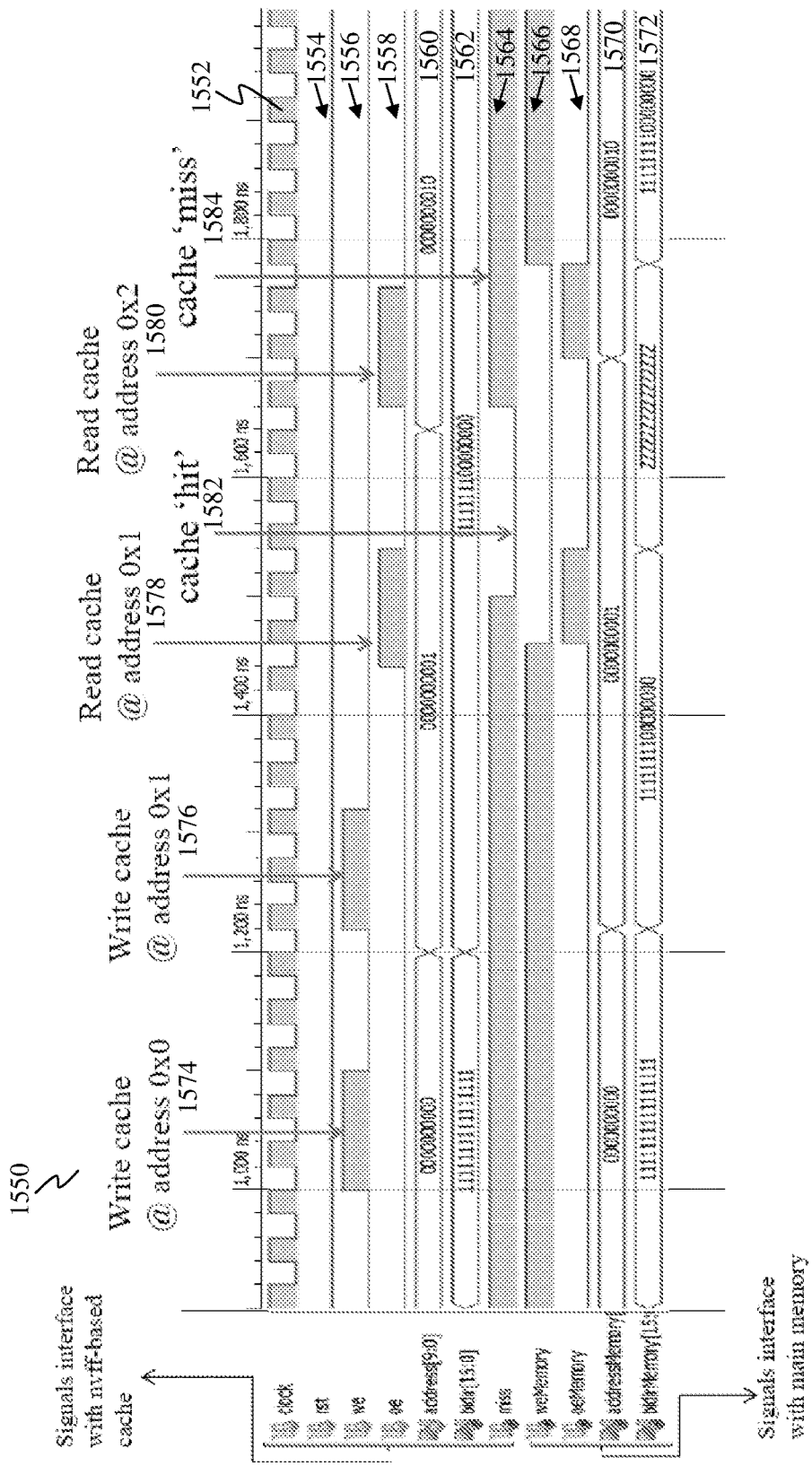
FIG. 15 shows a plot illustrating timing diagrams of various signals of a non-volatile cache architecture, in accordance with various embodiments.

FIG. 15 shows a plot 1550 illustrating timing diagrams of a non-volatile cache architecture, in accordance with various embodiments. In FIG. 15, signals interfacing with the non-volatile flip-flop (nvFF)-based cache may include a clock signal 1552, a reset (rst) signal 1554, a write enable (we) signal 1556, an output enable (oe) signal 1558, an address signal (bit 9:0) 1560, a bidirectional signal (bidir, bit 15:0) 1562, and a miss flag 1564. Signals interfacing with the main memory may include a write enable memory (weMemory) signal 1566, an output enable memory (oeMemory) signal 1568, an address memory (addressMemory, bit 9:0) 1570 signal and a bidirectional memory (bidirMemory, bit 15:0) 1572 signal. Result 1574 shows the write cache at address 0x0, and result 1576 shows the write cache at address 0x1. Result 1578 shows the read cache at address 0x1, and result 1580 shows the read cache at address 0x2. Result 1582 shows a cache 'hit' while result 1584 shows a cache 'miss'.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A flip-flop circuit comprising:
   a first stage circuit and a second stage circuit, wherein each of the first stage circuit and the second stage circuit is operable in two modes of operation, and wherein the two modes of operation are a read mode and a write mode; and
   a driver arrangement,
   wherein the first stage circuit comprises a first transistor and a first non-volatile memory cell connected to each other,
   wherein the second stage circuit comprises a second transistor and a second nonvolatile memory cell connected to each other, and
   wherein the driver arrangement is configured, at a clock level, to drive the first stage circuit in the read mode to read from the first non-volatile memory cell information that is written into the first non-volatile memory cell at a preceding clock level and, at the clock level, to drive the second stage circuit in the write mode to write the information that is read from the first non-volatile memory cell into the second non-volatile memory cell.

2. The flip-flop circuit as claimed in claim 1, wherein the first stage circuit further comprises a first buffer connected to the first transistor, and wherein the second stage circuit further comprises a second buffer connected to the second transistor.

3. The flip-flop circuit as claimed in claim 1, wherein the driver arrangement is further configured, at an additional clock level, to drive the first stage circuit in the write mode to write information into the first non-volatile memory cell and, at the additional clock level, to drive the second stage circuit in the read mode to read from the second non-volatile memory cell information that is written into the second non-volatile memory cell at a preceding clock level.

4. The flip-flop circuit as claimed in claim 1, wherein the driver arrangement comprises:
a first read driver and a first write driver comprised in the first stage circuit for accessing the first non-volatile memory cell; and
a second read driver and a second write driver comprised in the second stage circuit for accessing the second non-volatile memory cell.

5. The flip-flop circuit as claimed in claim 1, further comprising: a first multiplexer and a second multiplexer,
wherein the driver arrangement comprises:
a read driver coupled to the first multiplexer; and 10 a write driver coupled to the second multiplexer,
wherein, at the clock level, the read driver is configured to drive the first stage circuit in the read mode via the first multiplexer, and
wherein, at the clock level, the write driver is configured to drive the second stage circuit in the write mode via the second multiplexer.

6. The flip-flop circuit as claimed in claim 5,
wherein the read driver is further configured, at an additional clock level, to drive the second stage circuit in the read mode via the first multiplexer, and
wherein the write driver is further configured, at the additional clock level, to 20 drive the first stage circuit in the write mode via the second multiplexer.

7. The flip-flop circuit as claimed in claim 5, wherein the write driver comprises a tri-state buffer.

8. The flip-flop circuit as claimed in claim 1, further comprising:
a first multiplexer, a second multiplexer, a third multiplexer and a fourth multiplexer, wherein the third multiplexer is coupled to ground,
wherein the driver arrangement comprises:
a read driver coupled to the first multiplexer;
a bit line write driver coupled to the second multiplexer; and
a source line write driver coupled to the fourth multiplexer,
wherein, at the clock level, the read driver is configured to drive the first stage circuit in the read mode via the first multiplexer, and wherein the first stage circuit is further connected to the third multiplexer, and
wherein, at the clock level and depending on a value of information to be written, the bit line write driver is configured to drive the second stage circuit in the write mode via the second multiplexer or the source line write driver is configured to drive the second stage circuit in the write mode via the fourth multiplexer.

9. The flip-flop circuit as claimed in claim 8,
wherein, at an additional clock level, the read driver is further configured to drive the second stage circuit in the read mode via the first multiplexer, and wherein the second stage circuit is further connected to the third multiplexer, and
wherein, at the additional clock level and depending on a value of information to be written, the bit line write driver is further configured to drive the first stage circuit in the write mode via the second multiplexer or the source line write driver is further configured to drive the first stage circuit in the write mode via the fourth multiplexer.

10. The flip-flop circuit as claimed in claim 8, wherein each of the first non-volatile 20 memory cell and the second non-volatile memory cell comprises a bipolar memory cell.

11. The flip-flop circuit as claimed in claim 8, wherein each of the bit line write driver and the source line write driver comprises a tri-state buffer.

12. The flip-flop circuit as claimed in claim 1, further comprising a reference circuit configured to generate at least one reference current to be supplied to the first stage circuit and the second stage circuit.

13. The flip-flop circuit as claimed in claim 1, wherein each of the first non-volatile 30 memory cell and the second non-volatile memory cell comprises a resistive memory cell.

14. A memory device comprising:
a plurality of flip-flop circuits, wherein each flip-flop circuit of the plurality of flip-flop circuits is provided according to claim 1; and
a controller configured to control operation of the plurality of flip-flop circuits.

15. The memory device as claimed in claim 14, wherein the controller is configured to generate address values for accessing the plurality of flip-flop circuits.

16. The memory device as claimed in claim 14, wherein the controller is configured to receive an address value and to determine whether the address value is present or absent in the controller, and if the address value is present, the controller is further configured to access the flip-flop circuit of the plurality of flip-flop circuits corresponding to the address value.

17. A method of controlling a flip-flop circuit comprising a first stage circuit and a second stage circuit, wherein each of the first stage circuit and the second stage circuit is operable in two modes of operation, and wherein the two modes of operation are a read mode and a write mode, the method comprising:
driving, at a clock level, the first stage circuit in the read mode to read from a first non-volatile memory cell of the first stage circuit information that is written into the first non-volatile memory cell at a preceding clock level; and
driving, at the clock level, the second stage circuit in the write mode to write the information that is read from the first non-volatile memory cell into a second non-volatile memory cell of the second stage circuit.

18. The method as claimed in claim 17, further comprising:
driving, at an additional clock level, the first stage circuit in the write mode to write information into the first non-volatile memory cell, and
driving, at the additional clock level, the second stage circuit in the read mode to read from the second non-volatile memory cell information that is written into the second non-volatile memory cell at a preceding clock level.

* * * * *